(12) United States Patent
Kakutani et al.

(10) Patent No.: US 8,052,026 B2
(45) Date of Patent: Nov. 8, 2011

(54) ULTRASONIC HORN

(75) Inventors: Osamu Kakutani, Oume (JP); Yutaka Kondo, Tachikawa (JP); Kohei Seyama, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 618 days.

(21) Appl. No.: 11/544,231

(22) Filed: Oct. 6, 2006

(65) Prior Publication Data

US 2007/0080193 A1 Apr. 12, 2007

(30) Foreign Application Priority Data

Oct. 7, 2005 (JP) ................................. 2005-294928
Mar. 30, 2006 (JP) ................................. 2006-093294

(51) Int. Cl.
*B23K 1/06* (2006.01)

(52) U.S. Cl. ........................ 228/1.1; 228/110.1; 228/111

(58) Field of Classification Search ............... 228/110.1, 228/111, 1.1
See application file for complete search history.

(56) References Cited

U.S. PATENT DOCUMENTS

| | | | | |
|---|---|---|---|---|
| 5,364,005 A | * | 11/1994 | Whelan et al. ................. | 228/1.1 |
| 5,595,328 A | | 1/1997 | Safabakhsh et al. | |
| 5,820,011 A | * | 10/1998 | Ito et al. ......................... | 228/1.1 |
| 6,189,761 B1 | * | 2/2001 | Kyomasu ....................... | 228/1.1 |
| 7,137,543 B2 | | 11/2006 | DeAngelis et al. | |
| 2003/0000994 A1 | * | 1/2003 | Kyomasu et al. .............. | 228/1.1 |

FOREIGN PATENT DOCUMENTS

| | | |
|---|---|---|
| JP | 2001-24025 | 1/2001 |
| JP | 2001-38291 | 2/2001 |

* cited by examiner

*Primary Examiner* — Jessica L Ward
*Assistant Examiner* — Erin Saad
(74) *Attorney, Agent, or Firm* — Katten Muchin Rosenman LLP

(57) ABSTRACT

An ultrasonic horn used in, for instance, a wire bonding apparatus and formed with mounting flanges, including a slit and a cross-sectional shape varying portion; the slit being on the central axis in the horn's longitudinal direction and extending fore and aft relative to the center of the mounting flanges, the length of the slit(s) being equal to or greater than the width direction of a flange region that is between the opposing flanges, and at least a part of the cross-sectional shape varying portion being on the outer surface of the horn at a slit region in which the slit is formed. The stress center point in the cross-section of the ultrasonic horn at the flange region is positioned more to the inside than a straight line joining the stress center points in the cross-sections of the ultrasonic horn at the front and rear end portions of the slit.

13 Claims, 30 Drawing Sheets

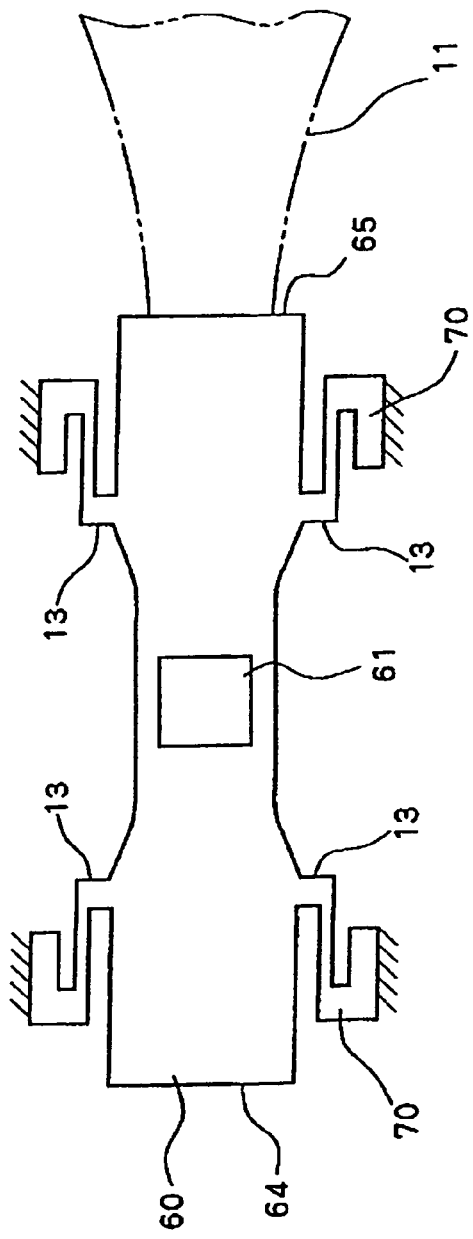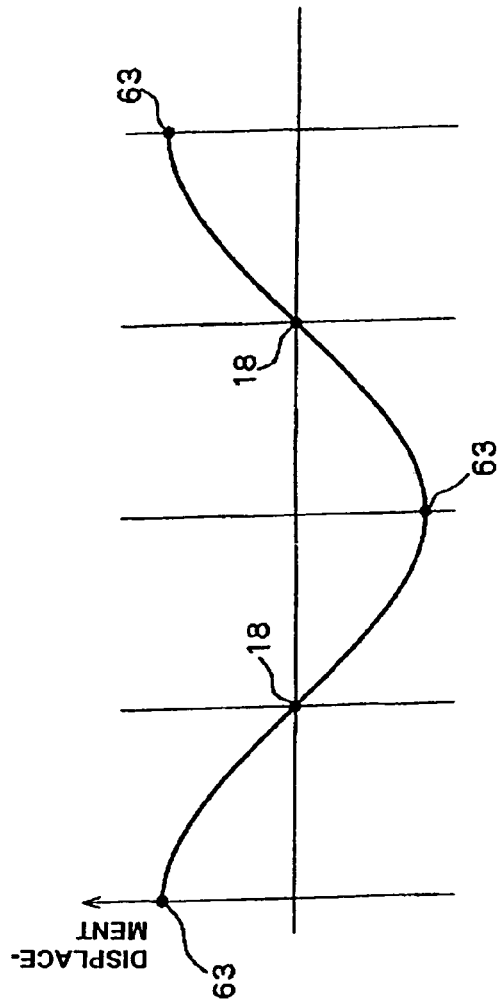
FIG. 29(a)
RELATED ART
FIG. 29(b)
RELATED ART

ULTRASONIC HORN

BACKGROUND OF THE INVENTION

The present invention relates to an ultrasonic horn used in wire bonding apparatuses or flip-chip bonding apparatuses or the like.

As shown in 24(a), an ultrasonic horn 10 used in a wire bonding apparatus or flip-chip bonding apparatus or the like is generally attached with a capillary 12, flanges 13, and ultrasonic vibrator 11.

The ultrasonic horn 10, which has a taper formed therein for the purpose of amplitude magnification, constitutes a truncated cone, so that it becomes gradually narrower toward the front end. The ultrasonic vibrator 11 is secured to the rear end portion of the ultrasonic horn 10. Ultrasonic vibration generated by this ultrasonic vibrator 11 is conveyed along the ultrasonic horn 10 as a longitudinal wave, and the ultrasonic horn 10 resonates at a resonant frequency determined by the shape and material thereof, so that a standing wave is generated. In the ultrasonic horn 10, a large-amplitude portion 16 and a node 18, where no amplitude occurs, are generated. FIG. 24(b) illustrates the amplitude generated in an ultrasonic horn, in which the amplitude of a plane (in the fore and aft dimension) perpendicular to the horn centerline of the ultrasonic horn is indicated on the vertical axis. The capillary 12 used for bonding is attached to the position 16, at the front end portion, where the amplitude becomes large. The ultrasonic horn 10 is attached to a wire bonding apparatus or a flip-chip bonding apparatus or the like by the flanges 13 attached at the position of the node 18 where no amplitude occurs.

FIG. 29(a) shows an ultrasonic horn 60 used in flip-chip bonding. In this ultrasonic horn 60, a tool (bonding tool) 61 that is a processing device is attached in the middle portion of the ultrasonic horn 60, and the ultrasonic vibrator 11 is attached to the rear end portion 65 of the ultrasonic horn 60. The ultrasonic horn 60, for the purpose of amplitude magnification, is designed so that it becomes narrower from both ends toward the middle portion where the tool 61 is attached.

The ultrasonic vibration generated by the ultrasonic vibrator 11 is conveyed along the ultrasonic horn 60 as a longitudinal wave, is reflected by the front end portion 64, and generates a standing wave in the ultrasonic horn 60. FIG. 29(b) is a diagram representing the manner of this standing wave. At the rear end portion 65 where the ultrasonic vibrator 11 is attached, and at the front end portion 64 where the ultrasonic wave is reflected, antinodes 63 where the amplitude of the standing wave is large are formed; and the portion where the tool 61 is attached also constitutes an antinode 63 and vibrates fore and aft. On the two sides of the tool 61, meanwhile, nodes 18 are generated where no amplitude occurs. At the positions of these nodes 18, the flanges 13 are formed. The flanges 13 have U-shaped attaching portions 70 on the outside thereof, so that the ultrasonic horn 60 is attached to a flip-chip bonding apparatus via the attaching portions 70.

As seen from FIG. 25, when ultrasonic horns 10 and 60 as described above are in a resonant state, a resonance-induced compressive stress P1 from the rear end portion and a resonance-induced compressive stress P2 from the front end portion act on the portions where the flanges 13 are formed which constitute nodes. Due to these stresses, the flange regions undergo compressive stress in the axial direction of the ultrasonic horn 10. Due to this compressive stress, at the flange regions of the ultrasonic horn 10, longitudinal strain is generated in the axial direction, and, together therewith, lateral strain is generated in a direction at right angles to the axis, by the measure of Poisson's ratio. As a result, the ultrasonic horns 10 and 60, in the flange regions, exhibit compressive deformation in the axial direction, and, together therewith, expansive deformation occurs in directions perpendicular to the axis, so that the radius r2 from the centerline of the flange regions is displaced by ϵ1 in a direction perpendicular to the axis by the expansive deformation, and the dimension thereof becomes r2+ϵ1. As a consequence thereof, both the front end positions of the flanges 13 and the positions of mounting holes 15 are displaced by substantially ϵ1 in directions perpendicular to the axis. Because this deformation is caused by the resonance of the ultrasonic horn, displacement appears in the form of vibration. Furthermore, since the flanges 13 are secured to a bonding apparatus, due to such displacement, stress would occur in the flanges 13 and the mounting holes 15.

In order to relieve such stress at the flange regions as described above, several structures are employed. In one structure, as shown in FIG. 24(a), the flange material thickness between the mounting hole 15 and the ultrasonic horn 10 is made thin (as disclosed in U.S. Pat. No. 5,595,328, for example). In another structure, cylindrical portions are provided in the flanges 13, and the ultrasonic horn 10 is supported by those portions (as described in Japanese Patent Application Laid-Open Disclosure (2001) No. 2001-24025. In a still another structure, U-shaped attaching portions 70 are provided outside the flanges 13, and the ultrasonic horn is supported by these portions (see Japanese Patent Application Laid-Open Disclosure (2001) No. 2001-38291). A structure is also employed wherein, as shown in FIG. 26 and FIG. 27, slots 21 are provided between the mounting holes 15 of the flanges 13 and the ultrasonic horn 10 (as shown in U.S. Pat. No. 5,595,328).

All of the above structures seek to relax the stresses that are in the horn securing portions (flanges), providing portions of lowered strength between the ultrasonic horn 10 and the portions for securing to a bonding apparatus, making provision so as to absorb distortion by the deformation of these portions.

There is also an ultrasonic horn in which, as shown in FIG. 28, a slot 21S is made in the flange region of the ultrasonic horn 10 (as disclosed in U.S. Pat. No. 5,595,328). With this structure, the ultrasonic horn 10 deforms on the slot 21S side due to expansion caused by compression, and stress is thus reduced; however, because the ultrasonic horn is secured to flanges along the circumference of the ultrasonic horn, for reasons of flange attachment strength, vibration in the flanges of the ultrasonic horn caused by expansion resulting from the compression described above cannot be suppressed.

The expansive deformation caused by compressive stress resulting from the ultrasonic waves described above is very small; however, when it is generated in the flange regions that constitute horn securing points where the ultrasonic horn is secured to, for instance, a wire bonding apparatus, there are adverse effects on ultrasonic resonance, such as the impedance becoming large and frequencies being generated which are shifted away from the ideal frequency, and bonding quality is caused to deteriorate, which has been a problem. The occurrence of minute vibrations, moreover, causes losses in ultrasonic horn vibration energy which are called "leaks"; as a result, capillary and/or tool vibration becomes insufficient, causing bonding quality to deteriorate, which has also been a problem.

In the meantime, when attempts are made to make wire bonding apparatuses or flip-chip bonding apparatuses operate faster, it becomes necessary that the ultrasonic horn be moved up and down at high speed. Such high speed up-and-down motion then exerts greater force on the supporting portions than conventionally. However, in the related art described above, portions of low strength are provided in the attaching portions to absorb the stresses generated in the securing portions; as a result, the support strength cannot stand up against the large forces occurring due to the faster speeds, and the ultrasonic horn vibrates in the up-and-down direction in conjunction with that up-and-down motion. In a wire bonding apparatus, in particular, when such vibration in the up-and-down direction occurs, excessive force acts on the ball during bonding, crushed ball shape defects occur, and the smaller ball diameters resulting when semiconductor devices become more fine in pitch can no longer be coped with, and that has been a problem. When efforts are made, conversely, to secure adequate strength in the attaching portions, then another problem occurs that vibration in the flange regions is suppressed.

BRIEF SUMMARY OF THE INVENTION

Accordingly, it is an object of the present invention to provide an ultrasonic horn in which the effects of minute expansive deformation caused by compressive stress during resonance are not exerted on the horn securing or mounting portions, and adverse effects on ultrasonic resonance, such as oscillating at frequencies shifted away from ideal frequencies, and leaks are prevented, thus enhancing bonding quality.

It is another object of the present invention to provide an ultrasonic horn in which flange support strength is preserved by way of not allowing the effects of the minute expansive deformation described above to be exerted on the horn securing portions, and vibration in the up-and-down direction of the ultrasonic horn is prevented.

It is still another object of the present invention to provide an ultrasonic horn that makes it possible to cope both with the faster speeds of wire bonding apparatuses and flip-chip bonding apparatuses and with the finer pitch effected in semiconductors by wire bonding apparatuses.

The above objects of the present invention are accomplished by a unique structure of the present invention for an ultrasonic horn that includes:
 a front end portion with a processing device attached thereto;
 a rear end portion larger in diameter than the front end portion;
 an ultrasonic vibrator being located on the rear end portion;
 a mounting flange provided on both lateral surfaces of the ultrasonic horn being located between the front end portion and the rear end portion, the mounting flange being at the node position of vibration generated by the ultrasonic vibrator;
 a slit region formed with a slit, the slit extending fore and aft relative to the center of the mounting flange, being on the central axis in the longitudinal direction of the ultrasonic horn, and the slit having a length being equal to or greater than the thickness of the mounting flange;
 a cross-sectional shape varying portion, at least a part of the cross-sectional shape varying portion being on the outer surface of the ultrasonic horn where the slit region is provided; and
 a stress center point of the cross-section of the ultrasonic horn at a flange region being positioned more to the inside, in the width direction of the ultrasonic horn, than a straight line joining the stress center points of cross-sections of the ultrasonic horn at the front end portion and the rear end portion of the slit.

In the above-described first aspect of the present invention, the cross-sectional shape varying portion is a curved surface located on at least one of intermediate portions between the flange region and the front end portion and between the flange region and the rear end portion.

In addition, the width of at least one of the front end portion and rear end portion of the slit is greater than the width of a middle portion of the slit in the flange region.

Furthermore, the ultrasonic horn is formed with a plurality of slits; and
 for each of the plurality of slits, a cross-sectional stress center point in the flange region of between the slit on the lateral surface side of the ultrasonic horn and the lateral surface of the ultrasonic horn is positioned more to the inside, in the width direction of the ultrasonic horn, than a straight line joining the cross-sectional stress center points at the front end portion and the rear end portion, respectively, of the slit in between the slit and the lateral surface of the ultrasonic horn.

Furthermore, the flange is integrally formed with the ultrasonic horn; and the above-described ultrasonic horn of the present invention is used in a wire bonding apparatus and in a flip-chip bonding apparatus.

The above objects of the present invention are accomplished by another unique structure of the present invention for an ultrasonic horn that includes:
 a front end portion with a processing device attached thereto;
 a rear end portion greater in diameter than the front end portion;
 an ultrasonic vibrator being located between the front end portion and the rear end portion, the ultrasonic vibrator being in THE interior of the ultrasonic horn;
 a mounting flange provided on both lateral surfaces of the ultrasonic horn at the central position of the ultrasonic vibrator;
 a slit region formed with a slit, the slit extending fore and aft relative to the center of the mounting flange, being on the central axis in the longitudinal direction of the ultrasonic horn, and the slit having a length being equal to or greater than the thickness of the mounting flange;
 a cross-sectional shape varying portion, at least a part of the cross-sectional shape varying portion being on the outer surface of the ultrasonic horn where the slit region is provided; and
 a stress center point of the cross-section of the ultrasonic horn at a flange region being positioned more to the inside, in the width direction of the ultrasonic horn, than a straight line joining the stress center points of cross-sections of the ultrasonic horn at the front end portion and the rear end portion of the slit.

In the above-described second aspect of the present invention, the cross-sectional shape varying portion is a curved surface located on at least one of the intermediate portions between the flange region and the front end portion and between the flange region and the rear end portion.

In addition, the width of at least one of the front end portion and the rear end portion of the slit is larger than the width of the middle portion of the slit in the flange region.

Furthermore, the ultrasonic horn is formed with a plurality of slits; and for each of the plurality of slits, a cross-sectional stress center point in the flange region of between the slit on the lateral surface side of the ultrasonic horn and the lateral surface of the ultrasonic horn is positioned more to the inside, in the width direction of the ultrasonic horn, than a straight line joining the cross-sectional stress center points at front end portion and rear end portion, respectively, of the slit in between the slit and the lateral surface of the ultrasonic horn.

In addition, in above-described second aspect of the present invention, the ultrasonic horn is formed with a plurality of slits between the ultrasonic vibrator and each one of the flanges formed on both lateral surface sides of the ultrasonic horn; and for each of the plurality of slits, a cross-sectional stress center point in the flange region of between the slit on the lateral surface side of the ultrasonic horn and the lateral surface of the ultrasonic horn is positioned more to the inside, in the width direction of the ultrasonic horn, than a straight line joining the cross-sectional stress center points at the front end portion and the rear end portion, respectively, of the slit in between the slit and the lateral surface of the ultrasonic horn.

Furthermore, the ultrasonic vibrator in the second aspect of the present invention can be provided inside a center hole having a threaded part and is formed from the rear end portion of the ultrasonic horn, the ultrasonic vibrator being on the same axis as the central axis, in the longitudinal direction of the ultrasonic horn, and a fixing screw, for making contact with the ultrasonic vibrator and securing the ultrasonic vibrator, is screwed into the threaded part of the center hole from the rear end portion side of the ultrasonic horn.

Furthermore, in the above-described ultrasonic horn, the flange is integrally formed with the ultrasonic horn; and the horn is used in a wire bonding apparatus and in a flip-chip bonding apparatus.

The above objects of the present invention are accomplished by still another unique structure of the present invention for an ultrasonic horn that includes:

a front end portion with a processing device attached thereto;

a rear end portion larger in diameter than the front end portion;

an ultrasonic vibrator being located on the rear end portion;

a mounting flange provided on both lateral surfaces of the ultrasonic horn being located between the front end portion and the rear end portion, the mounting flange being at a node position of vibration generated by the ultrasonic vibrator;

a first material portion made of a first material substance and formed with a slit, the slit extending fore and aft relative to a center of the mounting flange and being on a central axis in a longitudinal direction of the ultrasonic horn, and the slit having a length being equal to or greater than a thickness of the mounting flange;

a second material portion made of a second material substance having a smaller Young's modulus than the first material substance, the second material portion extending fore and aft relative to the center of the mounting flange and being formed, respectively, in an arch shape facing the slit from outer surfaces of the ultrasonic horn; and a stress center point of a cross-section of the first material portion of a cross-section of the ultrasonic horn at a flange region being positioned more to an inner side, with respect to a width direction of the ultrasonic horn, than a straight line joining the stress center points of the first material portion in cross-sections of the ultrasonic horn at a front end portion and a rear end portion of the slit.

The above objects of the present invention are accomplished by still another unique structure of the present invention for an ultrasonic horn that includes:

a front end portion with a processing device attached thereto;

a rear end portion larger in diameter than the front end portion, the rear end portion being cylindrical;

an ultrasonic vibrator being located on the rear end portion;

a mounting flange provided on both lateral surfaces of the ultrasonic horn being located between the front end portion and the rear end portion, the mounting flange being at a node position of vibration generated by the ultrasonic vibrator;

a circular ring-shaped gap portion having a circular ring-shaped gap, the circular ring-shaped gap extending in a fore-and-aft direction with respect to a center of the mounting flange, being concentric with a horn centerline in a longitudinal direction of the ultrasonic horn, and the circular ring-shaped gap having a length being equal to or greater than a thickness of the mounting flange;

a cross-sectional shape varying portion, at least a part thereof being on an outer surface of the ultrasonic horn at the circular ring-shaped gap portion; and a stress center circle of a cross-section of the ultrasonic horn at a flange region being positioned more to an inside, in a width direction of the ultrasonic horn, than a cylindrical surface joining stress center circles of cross-sections of the ultrasonic horn in a front end portion and a rear end portion of the circular ring-shaped gap portion.

In the above-described fourth aspect of the present invention, the cross-sectional shape varying portion is formed by a curved surface joining the outer circumference of the flange region of a cylindrical-shape and the outer circumference of a cylindrical-shape rear end portion.

In addition, the above ultrasonic horn may further includes: a center hole provided on the same axis as the central axis in the longitudinal direction of the ultrasonic horn; and a center rod provided on the same axis as the center hole, the outer diameter dimension of the center rod being smaller than the bore of the center hole.

Furthermore, the ultrasonic horn may further includes: a center hole having a threaded part being opened from the rear end portion of the ultrasonic horn on the same axis as the central axis in the longitudinal direction thereof; and a fixing screw having a pointed end portion, the outer diameter of the fixing screw being smaller than the bore diameter of the center of the circular ring-shaped gap portion, and the fixing screw being screwed into the threaded part of the center hole from the rear end portion side of the ultrasonic horn.

Furthermore, in the above-described fourth aspect of the present invention, each one of the bores of the front end portion and of the rear end portion of the center hole provided on the same axis as the central axis in the longitudinal direction of the ultrasonic horn is larger than the bore of the center hole in the flange region.

Furthermore, the flange is integrally formed with the ultrasonic horn; and the above-described ultrasonic horn is used in a wire bonding apparatus and in a flip-chip bonding apparatus.

The above objects of the present invention are accomplished by still another unique structure of the present invention for an ultrasonic horn that includes:

a front end portion with a processing device attached thereto;

a rear end portion greater in diameter than the front end portion;

an ultrasonic vibrator provided between the front end portion and the rear end portion, the ultrasonic vibrator being attached in the interior of the ultrasonic horn;

a mounting flange provided on both lateral surfaces of the ultrasonic horn at a position of the central position of the ultrasonic vibrator;

a circular ring-shaped gap portion having a circular ring-shaped gap, the circular ring-shaped gap extending in the fore-and-aft direction with respect to the center of the mounting flange, being concentric with the horn centerline in the longitudinal direction of the ultrasonic horn, and the circular ring-shaped gap having a length being equal to or greater than the thickness of the mounting flange;

a cross-sectional shape varying portion, at least a part thereof being on an outer surface of the ultrasonic horn at the circular ring-shaped gap portion; and a stress center circle of a cross-section of the ultrasonic horn at a flange region being positioned more to the inside, in the width direction of the ultrasonic horn, than cylindrical-surface joining stress center circles of cross-sections of the ultrasonic horn in the front end portion and the rear end portion of the circular ring-shaped gap portion.

In the above-described fifth aspect of the present invention, the cross-sectional shape varying portion is formed by a curved surface joining the outer circumference of the flange region of a cylindrical-shape and the outer circumference of a cylindrical-shape rear end portion.

The above-described ultrasonic horn may further includes: a center hole provided on the same axis as the central axis in the longitudinal direction of the ultrasonic horn; and a center rod provided on the same axis as the center hole, the outer diameter dimension of the center rod being smaller than the bore of the center hole.

The above-described ultrasonic horn may further includes: a center hole having a threaded part being opened from the rear end portion of the ultrasonic horn on the same axis as the central axis in the longitudinal direction thereof; and a fixing screw having a pointed end portion, the outer diameter of the fixing screw being smaller than the inner diameter of the center of the circular ring-shaped gap portion, and the fixing screw being screwed into the threaded part of the center hole from the rear end portion side of the ultrasonic horn.

In addition, in the above-described fifth aspect of the present invention, each one of bores of the front end portion and of the rear end portion of the center hole provided on the same axis as the central axis in the longitudinal direction of the ultrasonic horn is larger than the bore of the center hole in the flange region.

Furthermore, in the above-described ultrasonic horn: the ultrasonic vibrator is provided inside the center hole having a threaded part and is formed from the rear end portion of the ultrasonic horn, the ultrasonic vibrator being on the same axis as the central axis, in the longitudinal direction of the ultrasonic horn, and a fixing screw, for making contact with the ultrasonic vibrator and securing the ultrasonic vibrator, is screwed into the threaded part of the center hole from the rear end portion side of the ultrasonic horn.

In addition, in the above-described ultrasonic horn, the flange is integrally formed with the ultrasonic horn; and the ultrasonic horn is used in a wire bonding apparatus and in a flip-chip bonding apparatus.

The above objects of the present invention are accomplished by still another unique structure of the present invention for an ultrasonic horn that includes:

a rear end portion;

an ultrasonic vibrator being located on the rear end portion;

a front end portion becoming the antinodal end of vibration generated by the ultrasonic vibrator;

a processing device provided between the front end portion and the rear end portion, and the processing device being at the antinode position of vibration generated by the ultrasonic vibrator;

a plurality of mounting flanges provided on the opposite side from the processing device, the mounting flanges being at the node position of vibration generated by the ultrasonic vibrator in fore and aft directions of the processing device; and a plurality of curved portions curving from a side on which the mounting flanges are formed toward a side on which the processing device is provided, each one of the curved portions extending fore and aft with respect to the center of each one of the mounting flanges.

The above-described ultrasonic horn of the sixth aspect of the present invention is used in a flip-chip bonding apparatus.

The above objects of the present invention are accomplished by still another unique structure of the present invention for an ultrasonic horn that includes:

a rear end portion;

an ultrasonic vibrator being located on the rear end portion;

a front end portion becoming the antinodal end of vibration generated by the ultrasonic vibrator;

a processing device provided between the front end portion and the rear end portion, the processing device being at the antinode position of vibration generated by the ultrasonic vibrator;

a plurality of mounting flanges provided on both lateral surfaces of the ultrasonic horn, the mounting flanges being at the node position of vibration generated by the ultrasonic vibrator in fore and aft directions of the processing device;

a plurality of slit regions each formed with a slit, the slit extending fore and aft relative to the center of each one of the mounting flanges, being on the central axis in the longitudinal direction of the ultrasonic horn, and the slit having a length being equal to or greater than the thickness of the mounting flange;

a plurality of cross-sectional shape varying portions, at least a part of the cross-sectional shape varying portions being on the outer surface of the ultrasonic horn where the slit regions are provided; and a stress center point of a flange region in the cross-section of the ultrasonic horn being positioned more to the inside, in the width direction of the ultrasonic horn, than a straight line joining the stress center points of the front end portion and the rear end portion of the slit in the cross-section of the ultrasonic horn.

In the above-described seventh aspect of the present invention, a plurality of slit regions have a plurality of slits being formed to extend fore and aft with respect to the center of each one of the mounting flanges; and a stress center point of each one of the flange regions in a cross-section between the slit on the lateral surface side of the ultrasonic horn and the lateral surface of the ultrasonic horn is positioned more to the inside, in the width direction of the ultrasonic horn, than straight lines joining the stress center points of the front end portions and the rear end portions of each one of the slits regions in cross-sections between the slit on the lateral surface side of the ultrasonic horn and the lateral surface of the ultrasonic horn.

Furthermore, in the above-described seventh aspect of the present invention, the slit width of at least one of the front end portion side and the rear end portion side of each one of the slits is greater than the slit width of each one of the slits in the flange regions; and each one of the cross-sectional shape varying portions is a portion shaped with a curved surface located on at least one of side surfaces of the ultrasonic horn extending fore and aft with respect to the respective centers of the mounting flanges.

The ultrasonic horn of the seventh aspect of the present invention is used in a flip-chip bonding apparatus.

The above objects of the present invention are accomplished by still another unique structure of the present invention for an ultrasonic horn that includes:
  a front end portion;
  a rear end portion;
  a plurality of ultrasonic vibrators provided between the front end portion and the rear end portion, the ultrasonic vibrators being in the interior of the ultrasonic horn;
  a processing device provided between the front end portion and the rear end portion, and the processing device being at the antinode position of vibration generated by the ultrasonic vibrators;
  a plurality of mounting flanges provided on the opposite side from the processing device, the mounting flanges being at the node position of vibration generated by the ultrasonic vibrators in fore and aft directions of the processing device;
  a center position of the ultrasonic vibrators being disposed to coincide with the center of the mounting flanges;
  a plurality of slit regions having a plurality of slits, the slits extending fore and aft with respect to center of the mounting flanges, between each one of the ultrasonic vibrators and outer surfaces of the ultrasonic horn, the slits having a length being equal to or greater than the thickness of the mounting flanges;
  a plurality of cross-sectional shape varying portions, at least a part thereof being on the outer surface of the ultrasonic horn at each one of the slit regions; and
  a stress center point of a flange region in the cross-section between the slit on the outer surface side of the ultrasonic horn and the outer surface of the ultrasonic horn being positioned more to the inside, in the width direction of the ultrasonic horn, than straight lines joining the stress center positions of the front end portions and the rear end portions of the respective slits of the slit regions in cross-sections between the slit on the outer surface side of the ultrasonic horn and the outer surface of the ultrasonic horn.

In the above-described eighth aspect of the present invention, the slit width of at least one of the front end portion side and the rear end portion side of each one of the slits is greater than the slit width of each one of the middle portion of the slits in the flange regions; and each one of the cross-sectional shape varying portions is a portion shaped with a curved surface located on at least one of the lateral surfaces of the ultrasonic horn extending fore and aft with respect to the center of each one of the mounting flanges.

The ultrasonic horn of the eight aspect of the present invention is used in a flip-chip bonding apparatus.

The above objects of the present invention are accomplished by still another unique structure of the present invention for an ultrasonic horn that includes:
  a cylindrical front end portion;
  a cylindrical rear end portion;
  a plurality of ultrasonic vibrators provided between the cylindrical front end portion and the cylindrical rear end portion, the ultrasonic vibrators being in the interior of the ultrasonic horn;
  a processing device provided between the front end portion and the rear end portion, the processing device being at the antinode position of vibration generated by the ultrasonic vibrators;
  a plurality of mounting flanges provided on the opposite side from the processing device, the mounting flanges being at the node position of vibration generated by the ultrasonic vibrators in fore and aft directions of the processing device;
  a center position of the ultrasonic vibrators being disposed to coincide with the center of the mounting flanges;
  a plurality of circular ring-shaped gap portions each having a circular ring-shaped gap, the length of the circular ring-shaped gap being equal to or greater than the thickness of each one of the mounting flanges, extending in fore-and-aft directions with respect to the center of each one of the mounting flanges, being on the same axis as the center in the longitudinal direction of the ultrasonic horn;
  a plurality of cross-sectional shape varying portions, at least a part of each one of the cross-sectional shape varying portions being on the outer surface of the ultrasonic horn at each one of the circular ring-shaped gap portions; and
  a stress center circle of each of flange regions of the ultrasonic horn being positioned more to the inside, in the width direction of the ultrasonic horn, than a cylindrical surface joining stress center circles of the front end portions and the rear end portions of each of the circular ring-shaped gap portions of the ultrasonic horn.

In this ninth aspect of the present invention, the circular ring-shaped gap outer diameter at least one of front end portion and rear end portion of each one of the circular ring-shaped gap portions is greater than the circular ring-shaped gap portion outer diameter in the flange regions.

The ultrasonic horn of the ninth aspect of the present invention is used in a flip-chip bonding apparatus.

As seen from the above, according to the present invention, the effects of minute expansive deformation caused by compressive stress during resonance are not exerted on the horn securing portions, thus preventing adverse effects on ultrasonic resonance, such as oscillating at frequencies shifted away from ideal frequencies, as well as leaks, and, as a result, enhancing bonding quality.

Furthermore, according to the present invention, the flange support strength is preserved, and vibration in the up-and-down direction in the ultrasonic horn is prevented.

BRIEF DESCRIPTION OF THE SEVERAL VIEWS OF THE DRAWINGS

FIG. 29(a) is a top view of another ultrasonic horn of related art, and FIG. 29(b) is a graph showing the vibration in the ultrasonic horn of FIG. 29(a).

DETAILED DESCRIPTION OF THE INVENTION

Embodiment 1

Figure 1:
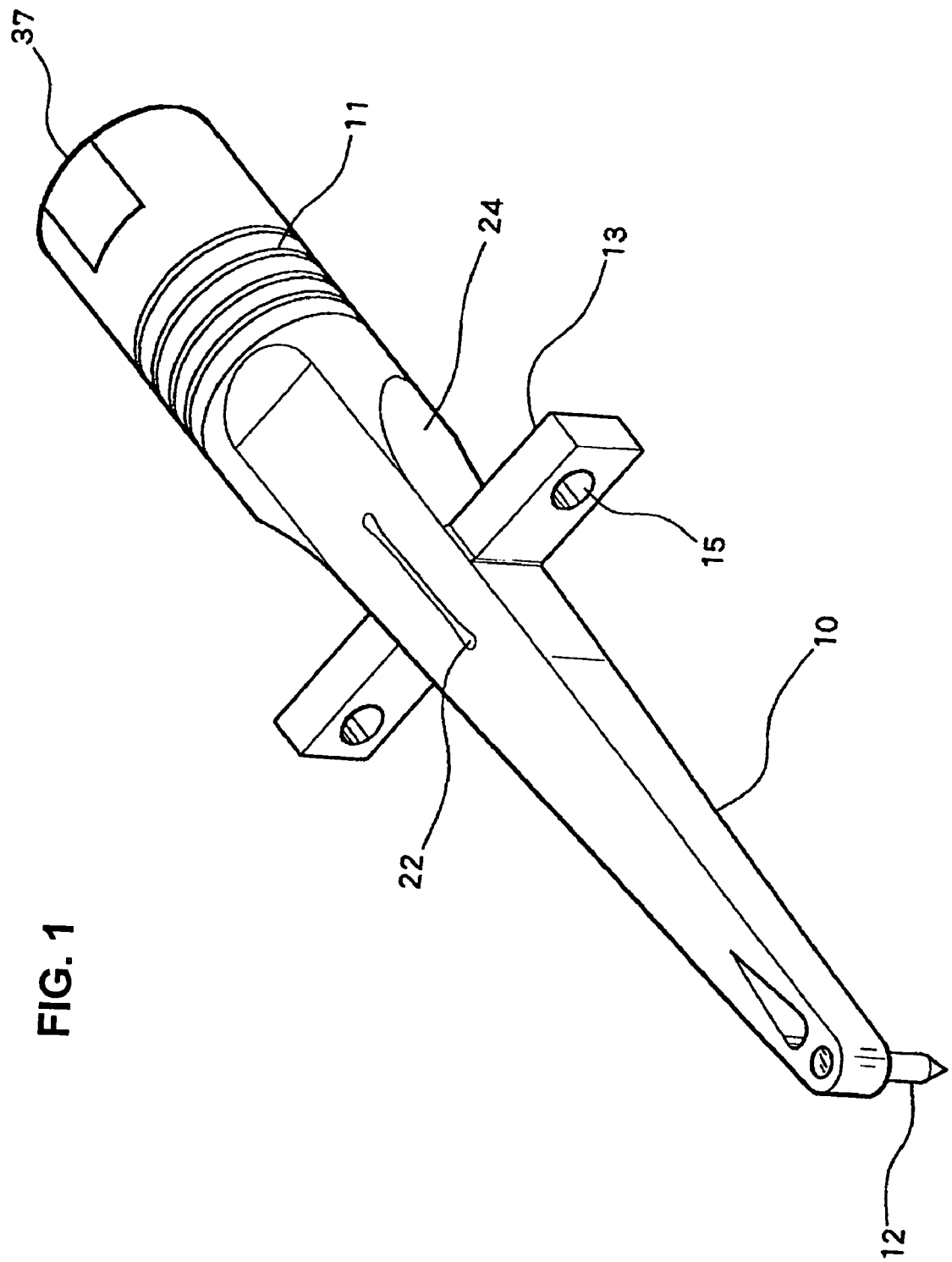
FIG. 1 is a perspective view of an ultrasonic horn according to the first embodiment of the present invention.
Figure 2:
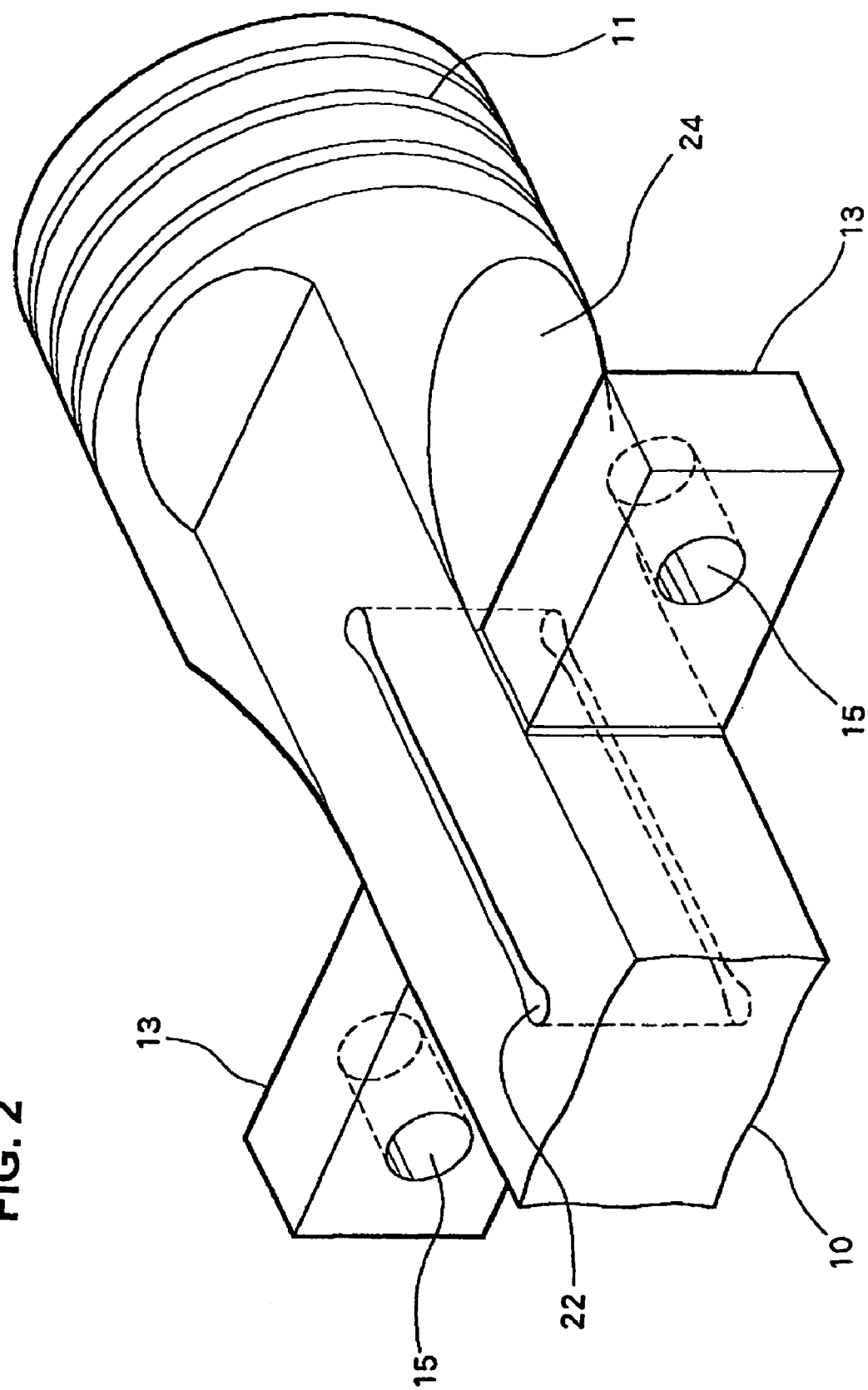
FIG. 2 is a perspective view of the flange region thereof.

The first embodiment of the present invention will be described with reference to FIG. 1 and FIG. 2. FIG. 1 is an overall perspective view of the ultrasonic horn of the first embodiment of the present invention, while FIG. 2 is a perspective view of the flange region of this ultrasonic horn.

The ultrasonic horn 10 of the first embodiment is used in a wire bonding apparatus, and it includes a capillary 12 which is a processing device, flanges 13, and an ultrasonic vibrator 11 as shown in FIG. 1.

In this ultrasonic horn 10, the front end portion where the capillary 12 is attached and the middle portion where the flanges 13 are provided have a rectangular cross-sectional shape, while the rear end portion has a circular cross-sectional shape. From the flange region toward the front end portion, the width gradually narrows for the purpose of amplitude magnification, becoming narrowest at the front end. The rear end portion of the ultrasonic horn 10 that has a circular cross-sectional shape is secured with the ultrasonic vibrator 11 by a nut 37. As described in the Background section of the present specification, the flanges 13 are provided in the portions where nodes of vibration are present. The flanges 13 are formed on two lateral surfaces of the ultrasonic horn 10, by a cutting process, so that they are integral with the ultrasonic horn 10. The ultrasonic horn 10 is mounted to a wire bonding apparatus using the flanges 13 and mounting holes 15 formed in the flanges.

The upper and lower surfaces of the ultrasonic horn 10 are flat surfaces having uniform thickness from the flange region to slightly forward of the rear end portion. From these flat surfaces toward the rear end portion, a cut-up portion is provided that is a slanted surface, connecting from the rectangular cross-sectional shape to the circular cross-sectional shape. Meanwhile, the two lateral surfaces of the ultrasonic horn 10 where the mounting flanges 13 are formed are cylindrical surfaces that extend from the flange region toward the rear end portion, connecting from the rectangular cross-section to the circular cross-sectional shape. This portion forms a cross-sectional shape varying portion 24 wherein, in accordance with the cylindrical surfaces of the lateral surfaces, the cross-sectional shape thereof gradually changes.

The ultrasonic horn 10 is formed with a slit 22. The slit 22 penetrates perpendicularly from the upper surface to the lower surface of the horn 10, and it is symmetric in the fore-and-aft (front-rear) direction, with respect to the flange centerline 13' (see FIG. 3), in the longitudinal (axial) direction of the horn 10. One end (rear end) of the slit 22 extends to the cross-sectional shape varying portion 24, and the width of slit 22 is wider (larger) at its front end and rear end, where the shapes are substantially cylindrical, than at its middle portion where the flange center line 13' comes across. The front and rear ends of the slit 22 have substantially cylindrical surfaces in order to prevent the reflection of ultrasonic vibration. The length of the slit 22 is equal to or greater than the thickness of the flanges 13 (the thickness of the flanges 13 being in the direction parallel to the slit 22); however, in this first embodiment, the slit 22 is longer than the thickness of the flanges 13 and also is longer than the width W (see FIG. 3) of the flange region of the ultrasonic horn. The slit 22 may have a parallel part in the middle or in the vicinity of the flange centerline 13'; and instead, it may also be of an overall ovaloid shape configured by curved surfaces.

Next, the operation of the above-described the ultrasonic horn 10 will be described with reference to FIG. 3, FIG. 4(a) through FIG. 4(e).

In the same manner as the operation of the ultrasonic horn in the related art described in the Background section, the ultrasonic vibration generated by the ultrasonic vibrator 11 travels along the ultrasonic horn 10 as a longitudinal wave, and the ultrasonic horn 10 as a result resonates at a resonant frequency determined by the shape and material thereof, generating a standing wave. In the shown ultrasonic horn 10, portions of large amplitude and a node where no amplitude occurs are produced in the fore-and-aft direction; and, at the position of the node, the flanges 13 are provided. As seen from FIG. 3, when the ultrasonic horn 10 is in a resonant state, a compressive stress P1 resulting from the resonance from the rear end portion and a compressive stress P3 resulting from the resonance from the front end portion act on the portion where the flanges 13 are provided that are at the node of vibration. Due to these stresses, the flange region sustains compressive stress in the axial direction of the ultrasonic horn 10.

The deformation which occurs around the slit 22 when such compressive stresses are imposed will be described below.

In the following description, the "ultrasonic horn cross-section at rear end portion of the slit" is, seen from FIG. 3, to be understood either (a) the cross-section of the ultrasonic horn at the rear end portion of the slit, or (b) when there is a portion in the rear end portion where the slit width becomes smaller like a cylindrical surface, then it is the cross-section of the ultrasonic horn in the portion where the slit width is widest (largest) near the rear end portion.

Moreover, the "ultrasonic horn cross-section at front end portion of the slit" is to be understood either (a') the cross-section of the ultrasonic horn in the front end portion of the slit, or, (b') when there is a portion in the front end portion where the slit width becomes smaller like a cylindrical surface, then it is the cross-section of the ultrasonic horn in the portion where the slit width is widest (largest) near the front end portion.

In addition, the "ultrasonic horn cross-section at flange region" is to be understood the cross-section of the ultrasonic horn on the flange centerline 13'.

The compressive stress P1 that acts from the ultrasonic horn rear end portion also acts as a compressive stress on the ultrasonic horn cross-section at rear end portion of the slit. By multiplying the cross-sectional area of the ultrasonic horn cross-section at rear end portion of the slit by the compressive stress, the load F1 acting at the stress center point 25 in the ultrasonic horn cross-section at rear end portion of the slit can be found. Here, the stress center point 25 ordinarily becomes the centroid of the ultrasonic horn cross-section at rear end portion of the slit, which, when it is necessary to consider the stress distribution, is a centroid found by effecting stress distribution weighting. As a result, the compressive stress P1 from the ultrasonic horn rear end portion can be substituted for by the load F1 acting on the stress center point 25 of the ultrasonic horn cross-section at rear end portion of the slit.

Likewise, the compressive stress P3 from the ultrasonic horn front end portion also can be substituted for by the load F3 acting on the stress center point 27 of the ultrasonic horn cross-section at the slit front end portion.

Furthermore, the compressive stresses from the rear end portion and front end portion of the ultrasonic horn both act also on the flange region. At the flange center position, the condition is one in which the directions of the stresses from the rear end portion and front end portion are opposite but the sizes thereof are equal. This also, by the same method as described above, can be substituted for by the loads F2, of opposite direction but of the same size, acting on the stress center point 26 of the ultrasonic horn cross-section at flange region.

Figure 3:
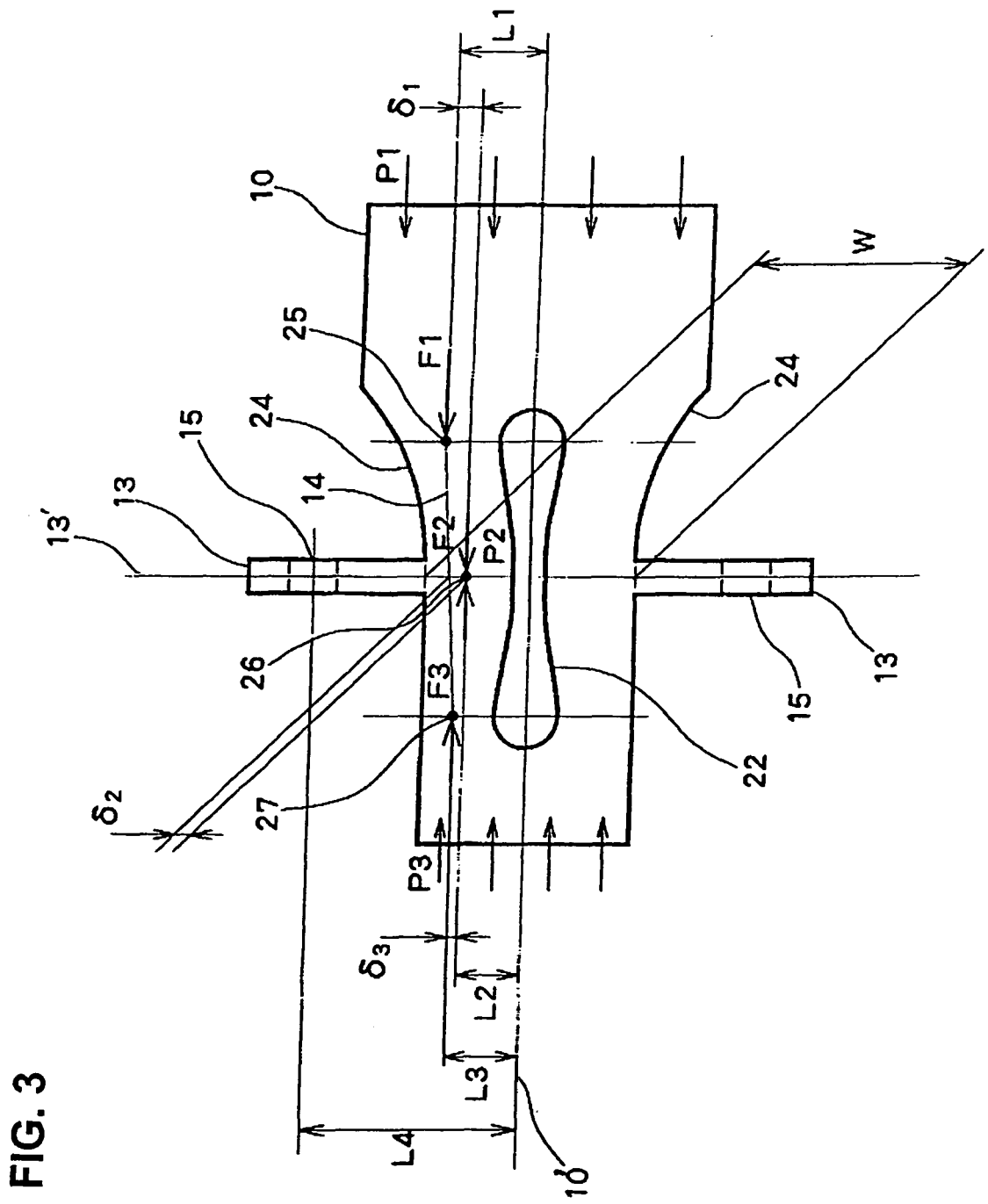
FIG. 3 is an operation diagram of the ultrasonic horn of the first embodiment of the present invention.

FIG. 3 shows the loads F1, F2, and F3, and the stress center points 25, 26, and 27, described above.

The distances from the center axis of the ultrasonic horn of the stress center points 25, 26, and 27 are L1, L2, and L3, respectively. L1 is larger than L2 because of the cross-sectional shape varying portion and because of the slit width of the slit front end portion which is wider than the slit width of the flange region. The difference between L1 and L2 is δ1. L3 is larger than L2 because the slit width at the slit front end portion is wider than the slit width at the flange region. The difference between L3 and L2 is δ3. As a consequence, the stress center point 26 in the ultrasonic horn cross-section at flange region is positioned more to the inside with respect to the width of ultrasonic horn 10 than the stress center point 25 in the ultrasonic horn cross-section at rear end portion of the slit and the stress center point 27 in the ultrasonic horn cross-section at the slit front end portion. Furthermore, the stress center point 26 in the ultrasonic horn cross-section at flange region is, with respect to the width of ultrasonic horn 10, inside of a straight line 14 joining the stress center point 25 in the ultrasonic horn cross-section at rear end portion of the slit and the stress center point 27 in the ultrasonic horn cross-section at the slit front end portion by a distance of δ2.

Figure 4A:
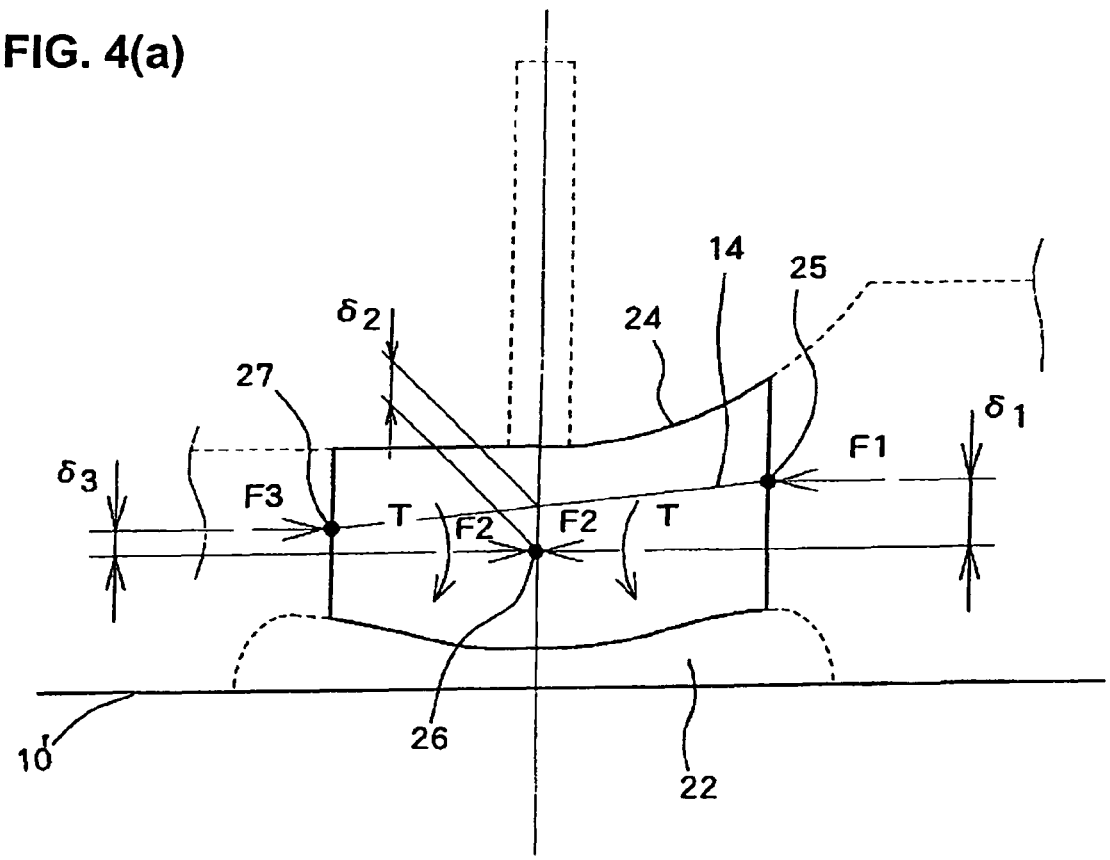
FIG. 4(a) is another operation diagram of the ultrasonic horn of the first embodiment.

As seen from the above, when loads are substituted by stresses and an element (or a part) of the portion between the ultrasonic horn cross-section at the flange region and the ultrasonic horn cross-section at rear end portion of the slit is particularly observed, it can be shown as in FIG. 4(a).

Figure 4B:
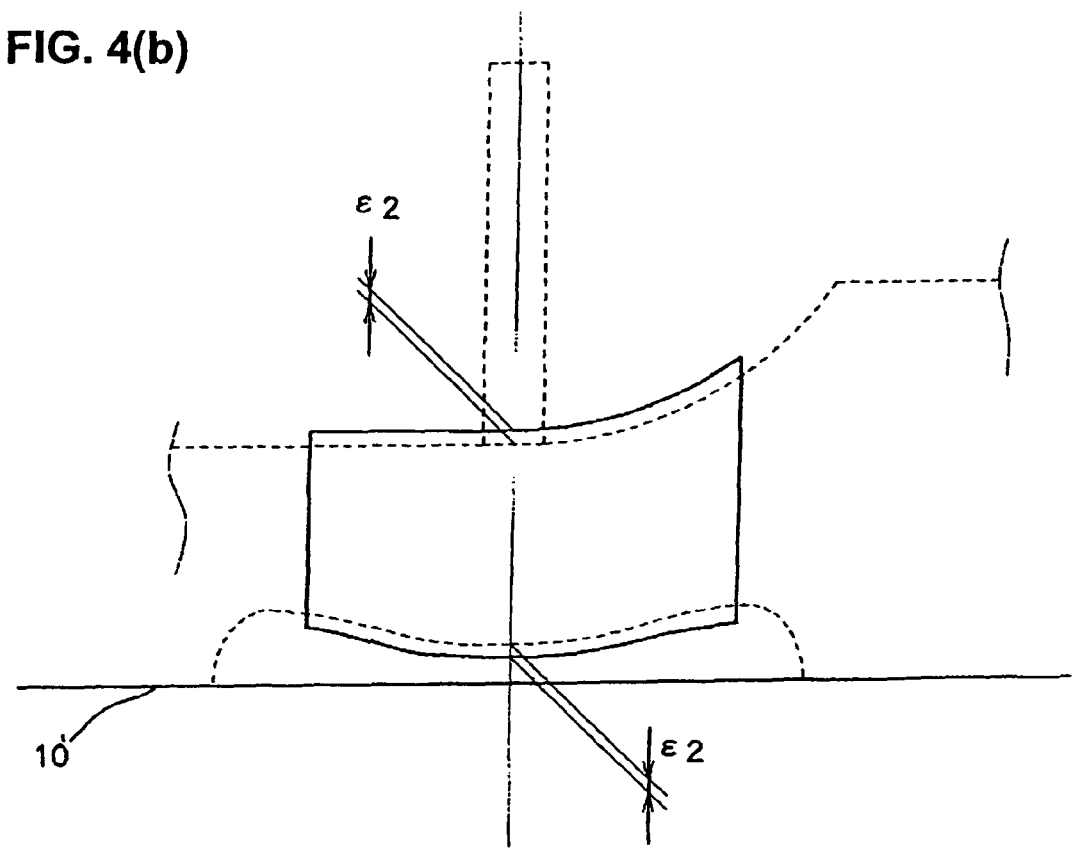
FIG. 4(b) is still another operation diagram of the ultrasonic horn of the first embodiment.

More specifically, on this element of the ultrasonic horn, the load F1 acts in the left direction from the rear end portion side of the ultrasonic horn, and the load F3 acts in the right direction from the front end portion side of the ultrasonic horn, and the element undergoes compression. As shown in FIG. 4(b), due to this compressive loading, the element is compressed in the fore and aft directions, and, in conjunction therewith, expands in directions that is at right angles to the axis of the element by the measure of Poisson's ratio, deforming so as to push the lateral surfaces, where the flanges are provided, out (as shown by the solid line) to the outside by a distance $\epsilon 2$, and so as to push the slit surfaces out (as shown by the solid line) on the horn centerline 10' side by a distance $\epsilon 2$.

Figure 4C:
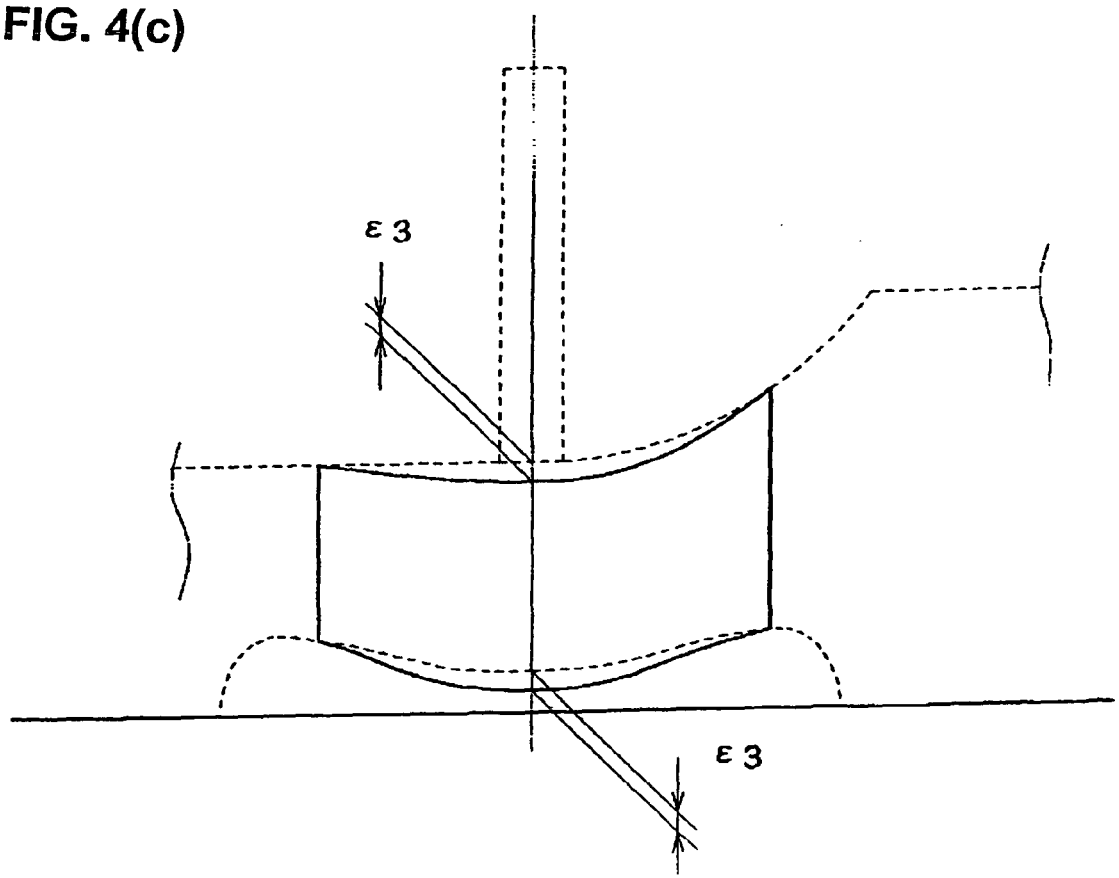
FIG. 4(c) is still another operation diagram of the ultrasonic horn of the first embodiment.

Meanwhile, as shown in FIG. 4(a), the straight line joining the stress center point 25 in the ultrasonic horn cross-section at rear end portion of the slit acted on by the load F1 and the stress center point 27 in the ultrasonic horn cross-section at front end portion of the slit acted on by the load F3, and the stress center point 26 in the ultrasonic horn cross-section at flange region, are shifted by δ2 in directions at right angles to the directions of the loads; accordingly, due to this shift amount δ2, the element of the ultrasonic horn is acted on by a bending moment that bends the element to the slit side; and as shown in FIG. 4(c), the element exhibits deformation by such a bending moment and is bent to the horn centerline 10' side where the slit is formed.

Figure 4D:
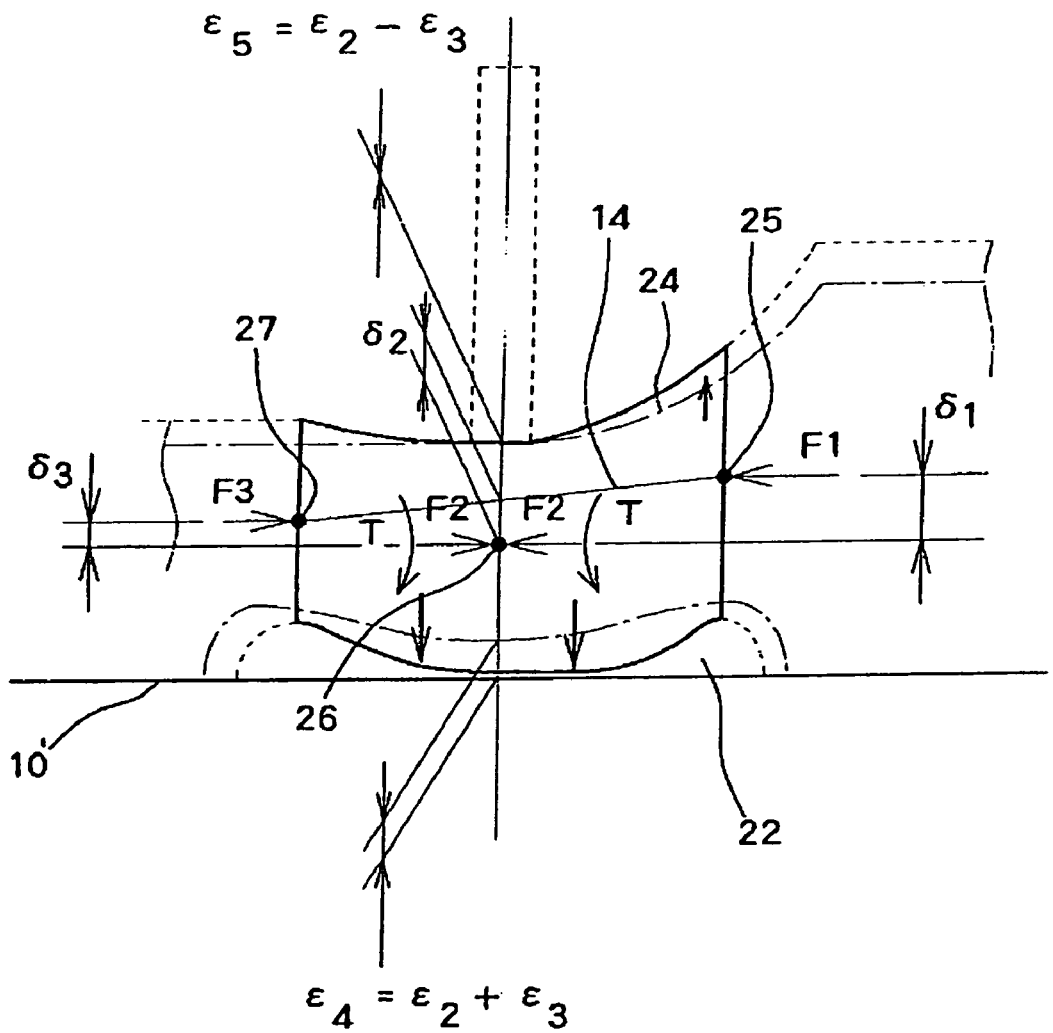
FIG. 4(d) is still another operation diagram of the ultrasonic horn of the first embodiment.

As shown in FIG. 4(d), resulting from this bending, the amount of displacement $\epsilon 3$, which is toward the horn centerline 10' side, and the amount of displacement $\epsilon 2$, which is toward the outside of the lateral surfaces where the flanges are provided, are opposite in direction but substantially equal in size; and the amount of displacement $\epsilon 5$ of the lateral surfaces of the horn where the flanges are provided becomes very small, equal to the difference therein, thus being ϵ2−ϵ3=ϵ5. Conversely, on the center axis side where the slit is disposed, the total displacement ϵ4 of the two amounts of displacement becomes ϵ2+ϵ3 (=ϵ4), so that larger displacement occurs on the horn centerline 10' side. Since the displacement of the lateral surfaces where the flanges 13 are formed is very small, the amount of change in the positions where the mounting holes 15 are opened in the flanges 13 also becomes very small.

Figure 4E:
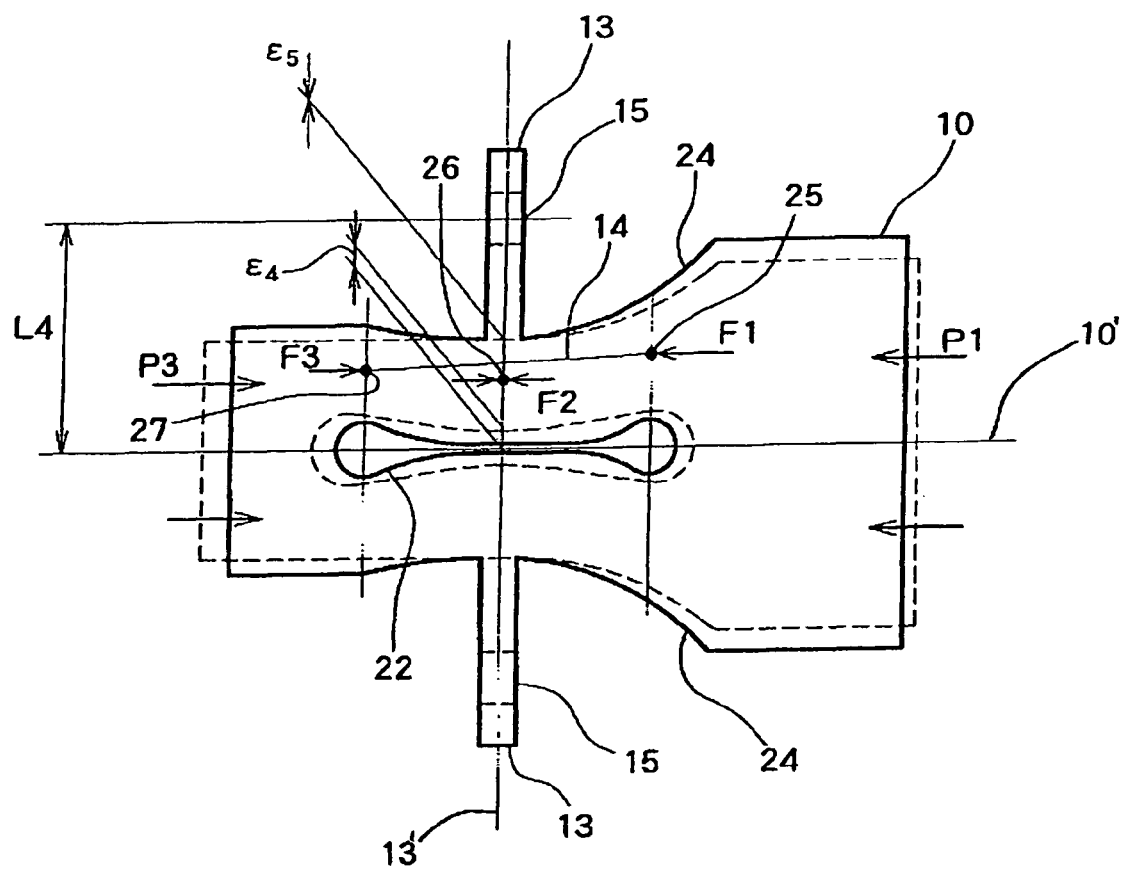
FIG. 4(e) is still another operation diagram of the ultrasonic horn of the first embodiment.

FIG. 4(e) shows how the flange region of the ultrasonic horn changes overall.

In FIG. 4(e), the solid lines indicate the shape after deformation, while the broken lines indicate the shape prior to deformation. Overall compressive deformation is exhibited due to the compressive stress P1 from the rear-end side and the compressive stress P3 from the front-end side. Meanwhile, the stress center point 26 in the ultrasonic horn cross-section at flange region is positioned more to the inside, with respect to the width of the ultrasonic horn, than the straight line 14 joining the stress center point 25 in the ultrasonic horn cross-section at rear end portion of the slit and the stress center point 27 in the ultrasonic horn cross-section at front end portion of the slit; accordingly, the lateral surfaces of the ultrasonic horn 10 where the flanges 13 are formed will be hardly displaced at all, and the horn center axis 10' side where the slit is disposed will be largely displaced, by ϵ4, toward the horn center axis 10' side. Because the displacement in the lateral surfaces where the flanges 13 are formed is very small, there will also be almost no change in the distance L4 that is from the horn center axis 10' to the mounting hole 15 of each one of the flanges 13.

As described above, in the shown embodiment of the present invention, the expansion displacement vibration caused by compression produced in the ultrasonic horn is canceled out by bending displacement vibration in the opposite direction.

This effect is also verified by a computer-based structural analysis. The structure analysis results obtained by the inventors indicate that the effectiveness of the cross-sectional shape varying portion 24 is particularly large. In other words, when a slit 22 is simply provided in an ultrasonic horn 10, the amount of displacement in directions at right angles to the axis of the mounting hole 15 is on the order of $10^{-7}$. However, with the cross-sectional shape varying portion 24 provided as in the present invention, this displacement amount is reduced to the order of $10^{-9}$. From this fact, it is clear that, by providing the cross-sectional shape varying portion 24, such a significant effect is manifested that the amount of displacement in the mounting hole 15 in each one of the flanges 13 can be reduced to a fraction equal to one (1) over several tens, or lower. Moreover, according to this structural analysis, the effect becomes pronounced when the slit length is made equal to or greater than the width W (see FIG. 3) of the flange region of the ultrasonic horn.

In the above-described embodiment, the cross-sectional shape varying portion 24 is provided between the flange region, from which the flanges 13 protrude laterally, and the rear end portion of the ultrasonic horn; however, the cross-sectional shape varying portion 24 can be provided between the flange region and the ultrasonic horn front end portion. In this configuration, the amount of displacement in the mounting holes 15 can be further reduced.

Furthermore, in the above-described embodiment of the present invention, the influence of minute expansive deformation caused by compressive stress during resonance does not extend to the horn securing portion (flanges); accordingly, ill effects on ultrasonic resonance such as oscillating at a frequency shifted from the ideal frequency, and leaks, are prevented, and bonding quality is, as a result, enhanced.

Furthermore, in the above-described embodiment, the influence of minute expansive deformation due to compressive stress during resonance does not reach the horn securing portion, even though no reduced strength portion is provided between the ultrasonic horn 10 and the mounting holes 15 that are the securing points for the flanges 13. Accordingly, the flanges 13 are able to have sufficient support strength, and vibrations in the up-and-down (vertical) direction in the ultrasonic horn 10 can be prevented.

As a consequence of the above, the horn has further advantages. In other words, the ultrasonic horn 10 can not only cope with the demand for higher bonding speeds in wire bonding apparatuses but also prevent defects in diameter in balls formed at the tip end of a bonding wire during wire bonding (wire tip ball diameter defects) can also be prevented. Accordingly, the present invention well contributes to finer pitches effected in semiconductor devices.

Furthermore, since the front end portion and the rear end portion of the slit 22 are made substantially cylindrical so as to prevent ultrasonic vibrations from being reflected, ultrasonic transmission efficiency is not compromised by the fact that the slit 22 is provided.

Embodiment 2

The second embodiment of the present invention will be described below with reference to FIG. 5. In the second embodiment, the same reference symbols are used to the parts that are the same as those in the embodiment described above, and further descriptions on those parts will not be provided.

Figure 5:
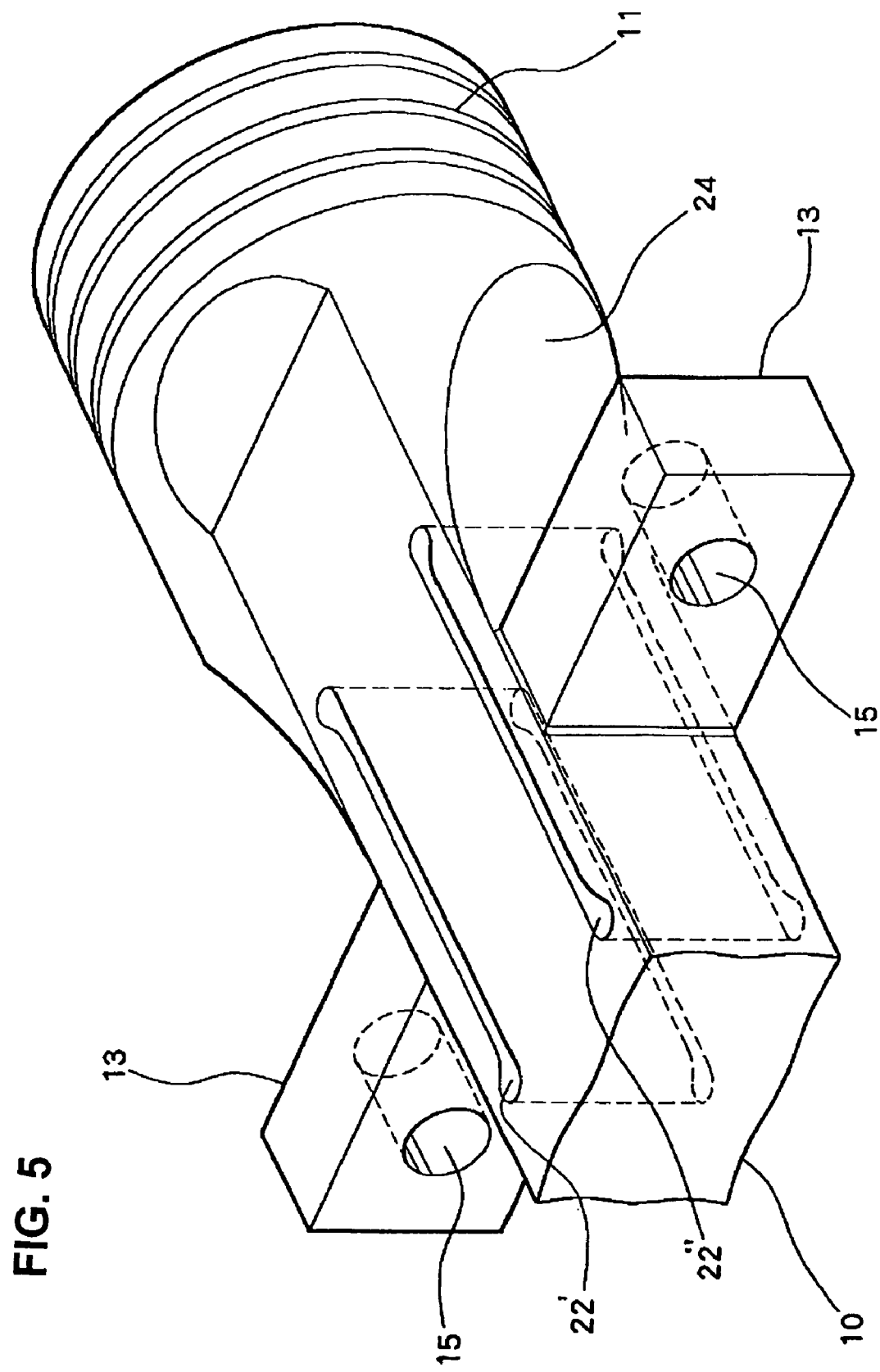
FIG. 5 is a perspective view of the flange region of an ultrasonic horn according to the second embodiment of the present invention.

The ultrasonic horn of the second embodiment is, as seen from FIG. 5, formed with a plurality of slits 22.

More specifically, the ultrasonic horn has two slits, first slit 22' and second slit 22". The front end portions and rear end portions of the slits 22' and 22" are made substantially cylindrical surfaces as in the first embodiment; however, in this second embodiment, the shapes of the slits 22' and 22" are made so that the centers of the cylindrical surfaces are offset on the lateral surface sides (toward the lateral surface sides) so that the slits do not protrude to the center axis side (inner side) of the ultrasonic horn 10.

The operation of the ultrasonic horn 10 is similar to that of the first embodiment.

More specifically, as can be recognized from FIG. 3 for the first embodiment, the stress center point 26 in the ultrasonic horn cross-section at the flange region is, with respect to the width of the ultrasonic horn, positioned more to the inside than the straight line 14 joining the stress center point 25 which is in the ultrasonic horn cross-section and at the first slit 22' rear end portion and the stress center point 27 in the ultrasonic horn cross-section at the first slit 22' front end portion. In addition, for the second slit 22" which is on the other side of the horn 10, the same occurs, in which the stress center point 26 in the ultrasonic horn cross-section at the flange region is, with respect to the width of the ultrasonic horn, positioned more to the inside than the straight line 14 joining the stress center point 25 which is in the ultrasonic horn cross-section and at the second slit 22" rear end portion and the stress center point 27 in the ultrasonic horn cross-section at the second slit 22" front end portion.

Accordingly, the displacement due to expansion in the ultrasonic horn lateral surfaces and the displacement due to bending therein are canceled out, and the displacement in those lateral surfaces becomes very small. Furthermore, because compressive stresses are absorbed by deformation toward the plurality of slits, while suppressing flange displacement, the stresses generated in the ultrasonic horn 10 can be reduced more than it is done with the first embodiment.

Embodiment 3

The third embodiment of the present invention will be described below with reference to FIG. 6. In the third embodiment, the same reference symbols are used to the parts that are the same as those in the first embodiment, and further descriptions on those parts will not be provided.

Figure 6:
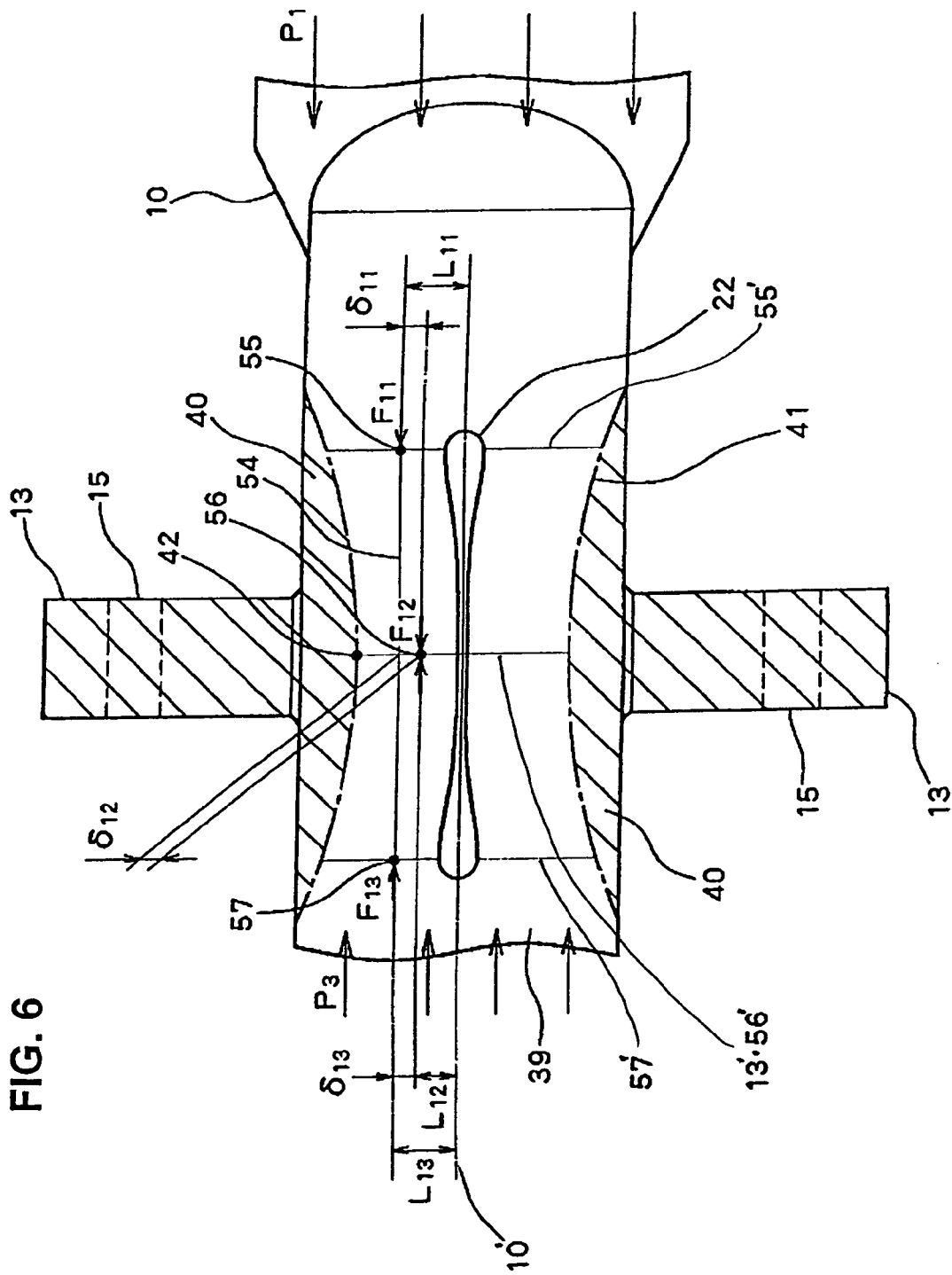
FIG. 6 is a top view in the longitudinal direction of the flange region of an ultrasonic horn according to the third embodiment of the present invention.

In the ultrasonic horn 10 of FIG. 6, around the center axis 10' of the ultrasonic horn 10 makes a first material portion 39; and inside of this first material portion 39 is provided a slit 22. The crosshatched portions in FIG. 6 are the second material portions.

More specifically, the first material that forms the first material portion 39 is, for example, stainless steel, while the second material that forms the second material portions 40 is, for example, aluminum having a smaller Young's modulus than the first material 39. The ultrasonic horn 10 is comprised of the first material portion 39 and the second material portions 40. As in the first embodiment, the flange region has a rectangular cross-section, and the second material portions 40 are formed in arch shapes, in horizontal cross section as seen from FIG. 6, expanding from the two lateral surfaces of the rectangular cross-sectional flange regions toward the slit 22 which is in the center. In other words, each of the second material portions 40 is thick in the vicinity of the flange centerline 13' and becomes thinner at increasingly greater distances from the flange centerline 13'. Boundaries 41 exist between the first material portions 39 and the second material portions 40.

The operation of the ultrasonic horn 10 of the third embodiment will be described in detail below.

In the ultrasonic horn of the third embodiment, as in the first embodiment, compressive stresses act from the front end portion and from the rear end portion. These forces, in addition to acting on the first material portion 39, act on the second material portions 40. However, due to the fact that the second material of the second material portions 40 has a lower Young's modulus than the first material of the second material portions 39, the deformation of the second material portions 40 will follow the deformation of the first material portion 39. In other words, the overall deformation will be determined by the deformation of the first material portion 39.

More specifically, in this third embodiment, as in the first embodiment, a compressive stress P1 imposed from the rear end portion of the ultrasonic horn acts as a compressive stress on the cross-section 55' in the first material portion of the ultrasonic horn at the rear end portion of the slit 22. By multiplying the cross-sectional area of the cross-section of the first material portion of the ultrasonic horn at this slit rear end portion by the compressive stress, the load F11 acting on the stress center point 55 in the ultrasonic horn cross-section at rear end portion of the slit of the first material portion can be found. Here, the stress center point 55 ordinarily becomes the centroid of the cross-section of the first material portion of the ultrasonic horn at the slit rear end portion, which, when it is necessary to consider the stress distribution, is a centroid found by effecting stress distribution weighting. As a result, the compressive stress P1 from the ultrasonic horn rear end portion can be substituted for by the load F11 acting on the stress center point 55 of the cross-section of the first material portion of the ultrasonic horn at the slit rear end portion. Likewise, the compressive stress P3 from the ultrasonic horn front end portion also can be substituted for by the load F13 acting on the stress center point 57 of the cross-section 57' of the first material portion of the ultrasonic horn at the slit front end portion. Furthermore, the compressive stresses from the rear end portion and from the front end portion of the ultrasonic horn both act also on the flange region where the flanges 13 are provided. At the flange center position which is on the flange centerline 13', the situation is that the directions of the stresses from the rear end portion and from the front end portion are opposite but are equal in size. This also, by the same method as described above, can be substituted for by the loads F12 which are in the opposite directions but of the same size and acting on the stress center point 56 of the cross-section of the first material portion of the ultrasonic horn at the flange region.

The loads F11, F12, and F13 and the stress center points 55, 56, and 57 described above are indicated in FIG. 6.

The distances from the center axis 10' of the ultrasonic horn 10 to the stress center points 55, 56, and 57 are L11, L12, and L13, respectively. The first material portion 39 is narrow in the vicinity of the flange centerline 13' but becomes thicker at increasingly greater distances from the flange centerline 13'. For this reason, the stress center point 56 in the cross-section 56' of the first material portion of the ultrasonic horn at the flange region is, with respect to the width of the horn 10, positioned more to the inside of the horn 10, by a distance δ12, than a straight line 54 joining the stress centers 55 and 57 in the cross-sections 55' and 57' of the ultrasonic horn at the front end and rear end portions of the slit. As a result, as in the first embodiment, the expansive displacement vibration of the first material portion due to compressive forces can be cancelled out by bending displacement vibration which is in the opposite direction.

Meanwhile, the second material portions 40 are lower in Young's modulus than the first material portion 39 and are deformed following the deformation of the first material portion 39. Accordingly, the position of the intersection 42 between the flange centerline 13' and the boundary 41 between the first material portion 39 and the second material portion 40 is hardly displaced at all, the positions of the mounting holes 15 in the flanges 13 are also hardly displaced at all. Accordingly, as in the first embodiment, flange displacement and vibration can be prevented.

Embodiment 4

Figure 7:
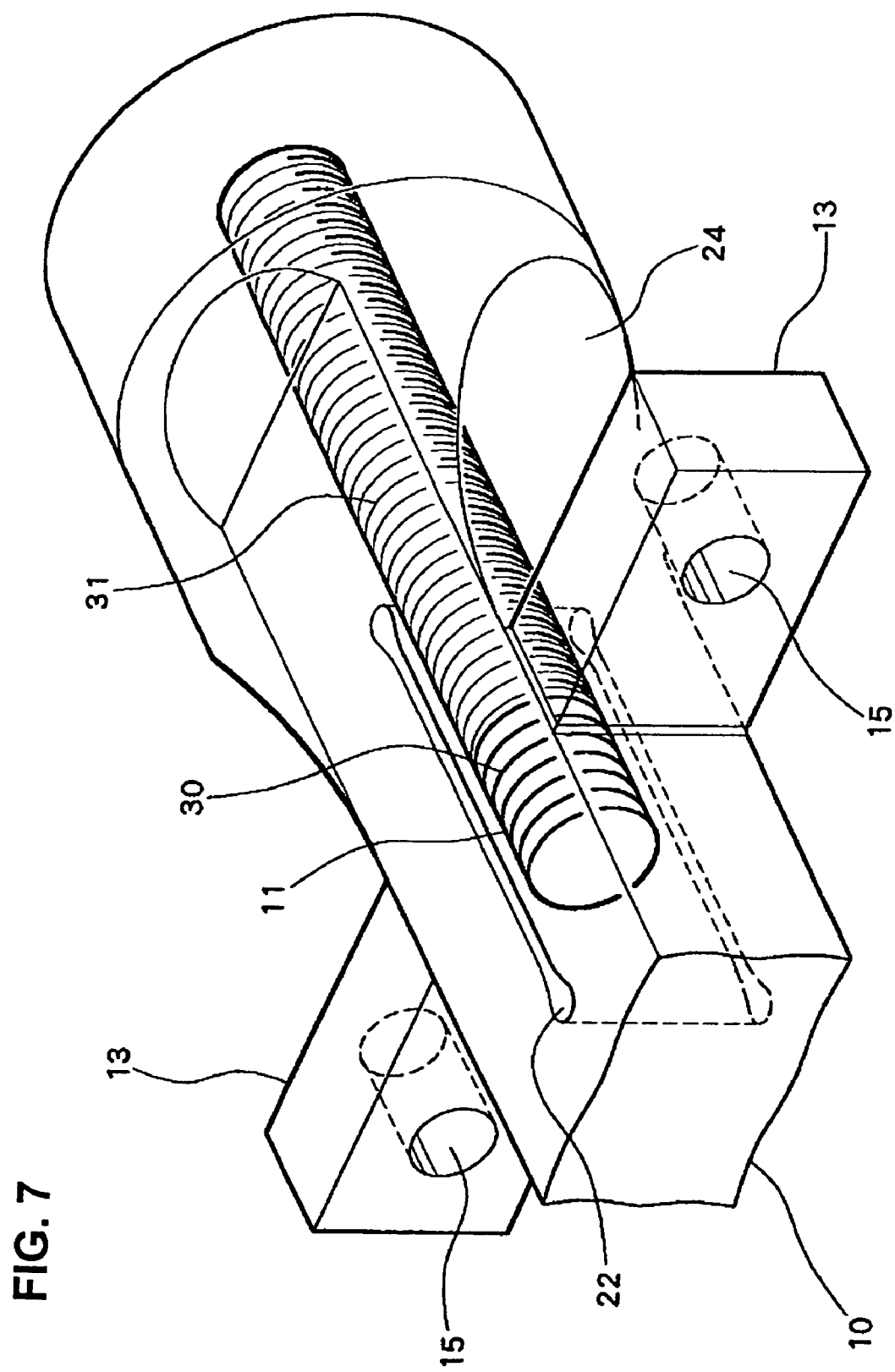
FIG. 7 is a perspective view of the flange region of an ultrasonic horn according to the fourth embodiment of the present invention.

The fourth embodiment of the present invention will be described below with reference to FIG. 7. FIG. 7 is a perspective view of the flange region of the ultrasonic horn 10 of the fourth embodiment; and in this fourth embodiment, the same reference symbols are used for the parts that are the same as those in the first embodiment, and further descriptions on those parts will not be provided.

The ultrasonic horn 10 of the fourth embodiment is employed in a wire bonding apparatus. A center hole 30 is axially formed in the interior thereof; and inside of this center hole 30, the ultrasonic vibrator 11 is provided and is secured by a fixing bolt 31 screwed in from the rear end portion of the ultrasonic horn. The center hole 30 has a bore that is only very slightly larger than that of the ultrasonic vibrator 11. There is a minute circular ring-shaped gap (not shown) between the fixing bolt 31 and the center hole 30, so that the ultrasonic horn 10 and the ultrasonic vibrator 11 are not in contact. The ultrasonic vibrator 11 has its vibration node at its middle position in the axial direction; accordingly, the flanges 13 are provided on the two lateral surfaces of the ultrasonic horn at the middle position in the axial direction of the ultrasonic vibrator 11. Moreover, same as the first embodiment, a cross-sectional shape varying portion 24 is provided on the lateral surfaces located between the flanges 13 and the ultrasonic horn rear end portion; and a slit 22 is provided to penetrate, perpendicularly, from the upper surface to the lower surface and to be symmetric in the fore-and-aft direction, with respect to the flange centerline (not shown), in the longitudinal direction (axial direction) of the horn 10. The slit position, shape, and length are the same as in the first embodiment.

The operation of the ultrasonic horn 10 of the fourth embodiment of the present invention is the same as that of the first embodiment. Because the stress center point 26 (see FIG. 3) in the ultrasonic horn cross-section at flange region is positioned more to the inside than the straight line 14 joining the stress center point 25 in the ultrasonic horn cross-section at rear end portion of the slit and the stress center point 27 in the ultrasonic horn cross-section at front end portion of the slit, the displacement caused by expansion in the ultrasonic horn lateral surfaces and the displacement caused by bending therein are canceled out, and the displacement in those lateral surfaces becomes very small.

As a result, it is possible to make the influence of minute expansive deformation caused by compressive stress during resonance not reach the horn securing portion (the flanges); and, in addition, the flanges 13 have sufficient support strength. Accordingly, as in the first embodiment described above, adverse effects on ultrasonic resonance such as oscillating at a frequency shifted from the ideal frequency, and leaks, are prevented, enhancing the bonding quality; and, at the same time, vibration in the up-and-down direction in the ultrasonic horn can be prevented. Moreover, since the ultrasonic vibrator 11 and the flanges 13 are set to be at the same node, flange vibration produced by differences in the position of the node and the position of the flanges 13 can be prevented. Furthermore, in view of the fact that the structure of the fourth embodiment can be made compact because the ultrasonic vibrator 11 is attached in the interior of the ultrasonic horn 10, not only can vibration in the up-and-down direction be prevented better but also wire tip ball diameter defects can be prevented. As a result, the ultrasonic horn 10 can cope with the demand for even higher bonding speeds in wire bonding apparatuses and with finer pitch in semiconductor devices.

Embodiment 5

Figure 8:
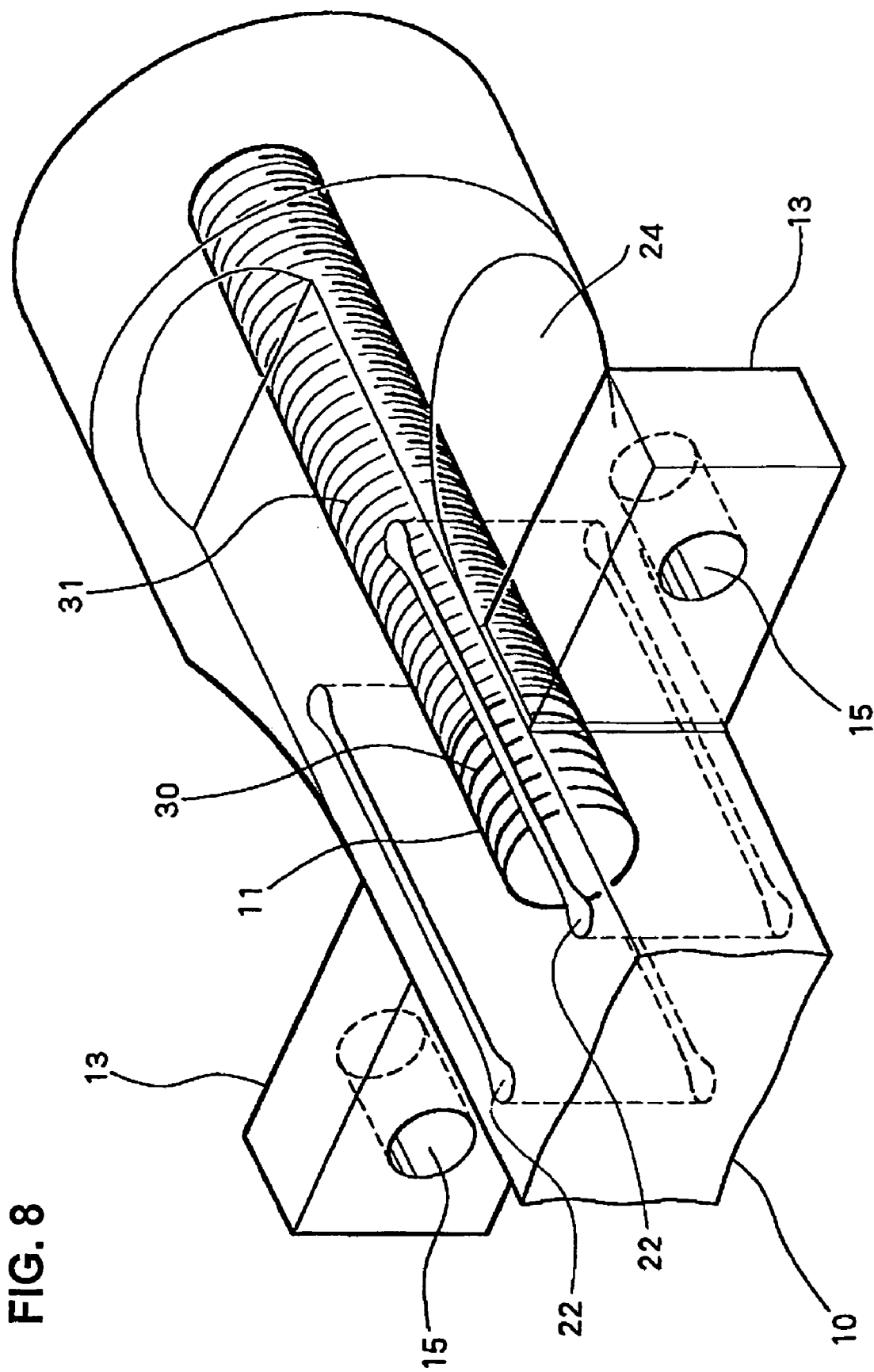
FIG. 8 is a perspective view of the flange region of an ultrasonic horn according to the fifth embodiment of the present invention.

The fifth embodiment of the present invention will be described below with reference to FIG. 8. FIG. 8 is a perspective view of the flange region of the ultrasonic horn 10 of the fifth embodiment of the present invention. In the following description, the same reference symbols are used for the parts that are the same as those in the first or fourth embodiment, and further descriptions on those parts will not be provided.

The ultrasonic horn 10 of the fifth embodiment is employed in wire bonding apparatuses, and it has the same structure as in the fourth embodiment and is provided with an ultrasonic vibrator 11 secured in the interior thereof by a fixing bolt 31 from the rear end portion of the ultrasonic horn. Flanges 13 are provided at the two lateral surfaces of the ultrasonic horn 10 that correspond to an axially middle position of the ultrasonic vibrator 11, and, as in the first embodiment described above, a cross-sectional shape varying portion 24 is provided on the lateral surfaces between the flanges 13 and the rear end portion of the ultrasonic horn. At positions corresponding to between the center hole 30 in the interior and the two lateral surfaces of the ultrasonic horn, respectively, two slits 22 are provided perpendicularly, penetrating from the upper surface to the lower surface. These slits 22 are symmetrical in the fore-and-aft direction with respect to the flange centerline (not shown) in the longitudinal direction (axial direction) of the horn 10. The shape of the slits is the same as that of the first embodiment.

The operation of the ultrasonic horn 10 of the fifth embodiment of the present invention is the same as that of the first embodiment.

More specifically, as can be seen from FIG. 3, the stress center point 26 in the cross-section between the slits 22 of the ultrasonic horn at the flange region and the lateral surfaces of the ultrasonic horn is positioned more to the inside than a straight line 14 joining the stress centers 25 and 27 in the cross-sections between the lateral surfaces of the ultrasonic horn and the slits 22 of the ultrasonic horn at the front end portion and rear end portion of the slits. Accordingly, the displacement caused by expansion in the lateral surfaces of the ultrasonic horn and the displacement caused by bending therein are canceled out, and the displacement in those lateral surfaces becomes very small. In the fifth embodiment, since two slits 22 are provided, the displacement in the lateral surfaces of the ultrasonic horn is reduced even further than it can be by the first or fourth embodiment. Accordingly, in addition to the advantages of the second embodiment, in the ultrasonic horn 10 of the fifth embodiment, the wire bonding quality is further enhanced, and the demand for higher bonding speeds in wire bonding apparatus and finer pitch in semiconductor devices can be better coped with.

Embodiment 6

The sixth embodiment of the present invention will be described below with reference to FIG. 9 to 12.

Figure 9:
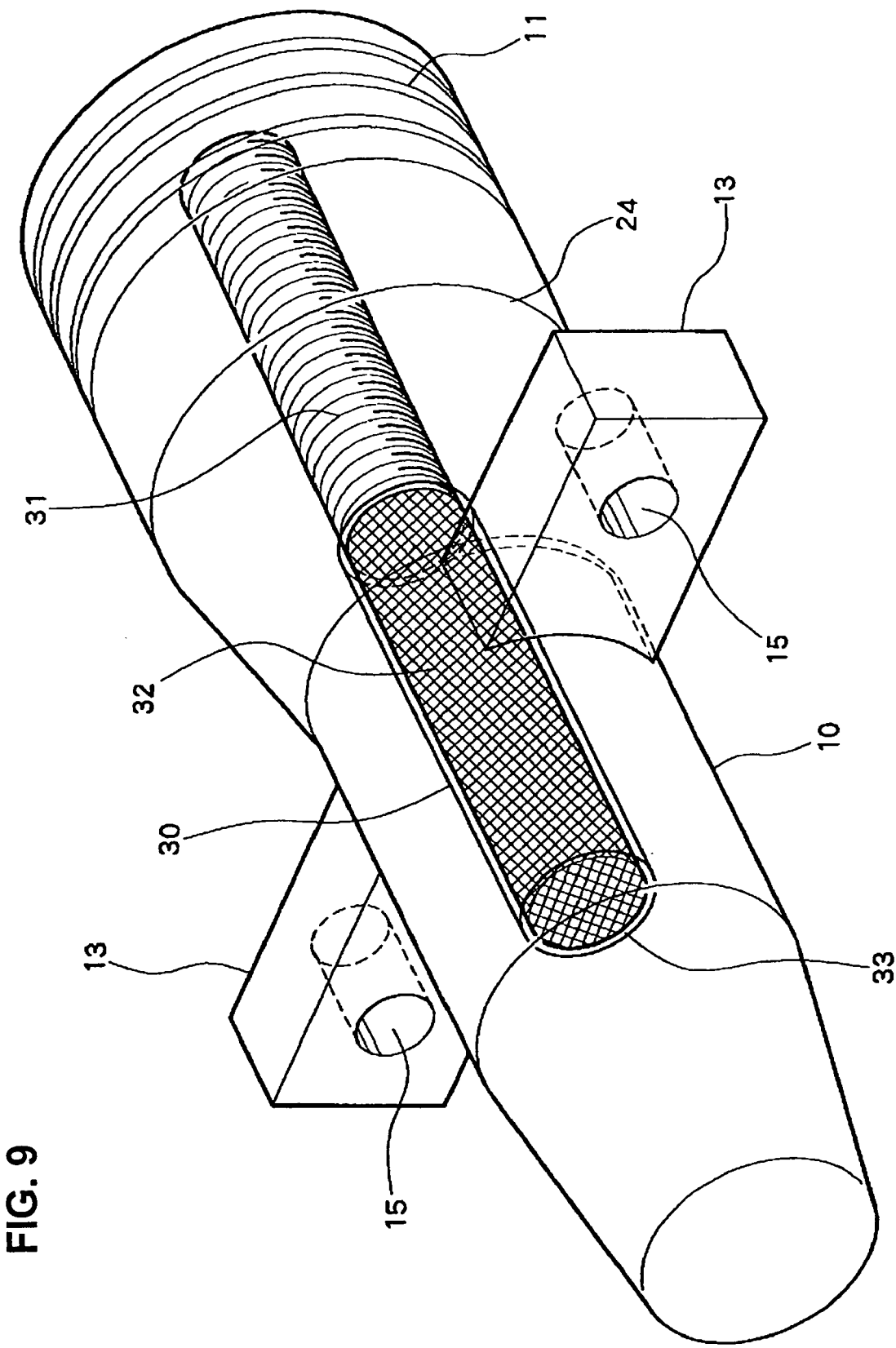
FIG. 9 is a perspective view of the flange region of an ultrasonic horn according to the sixth embodiment of the present invention.
Figure 10:
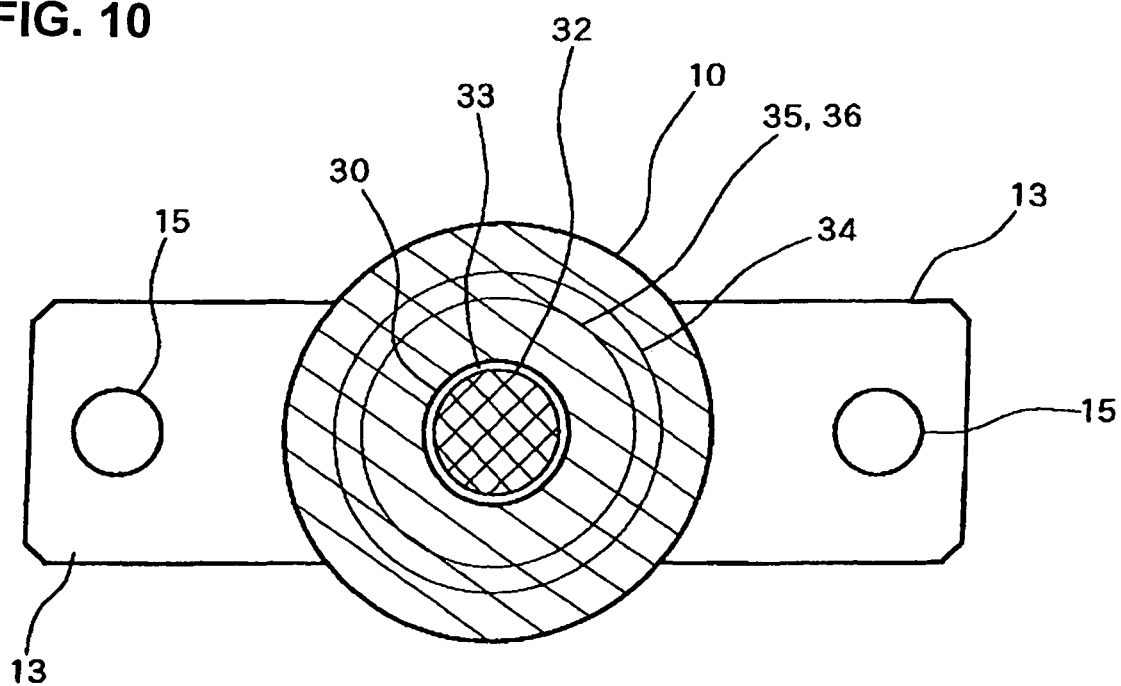
FIG. 10 is a vertical cross-sectional view of the flange region of the ultrasonic horn of the sixth embodiment.
Figure 11:
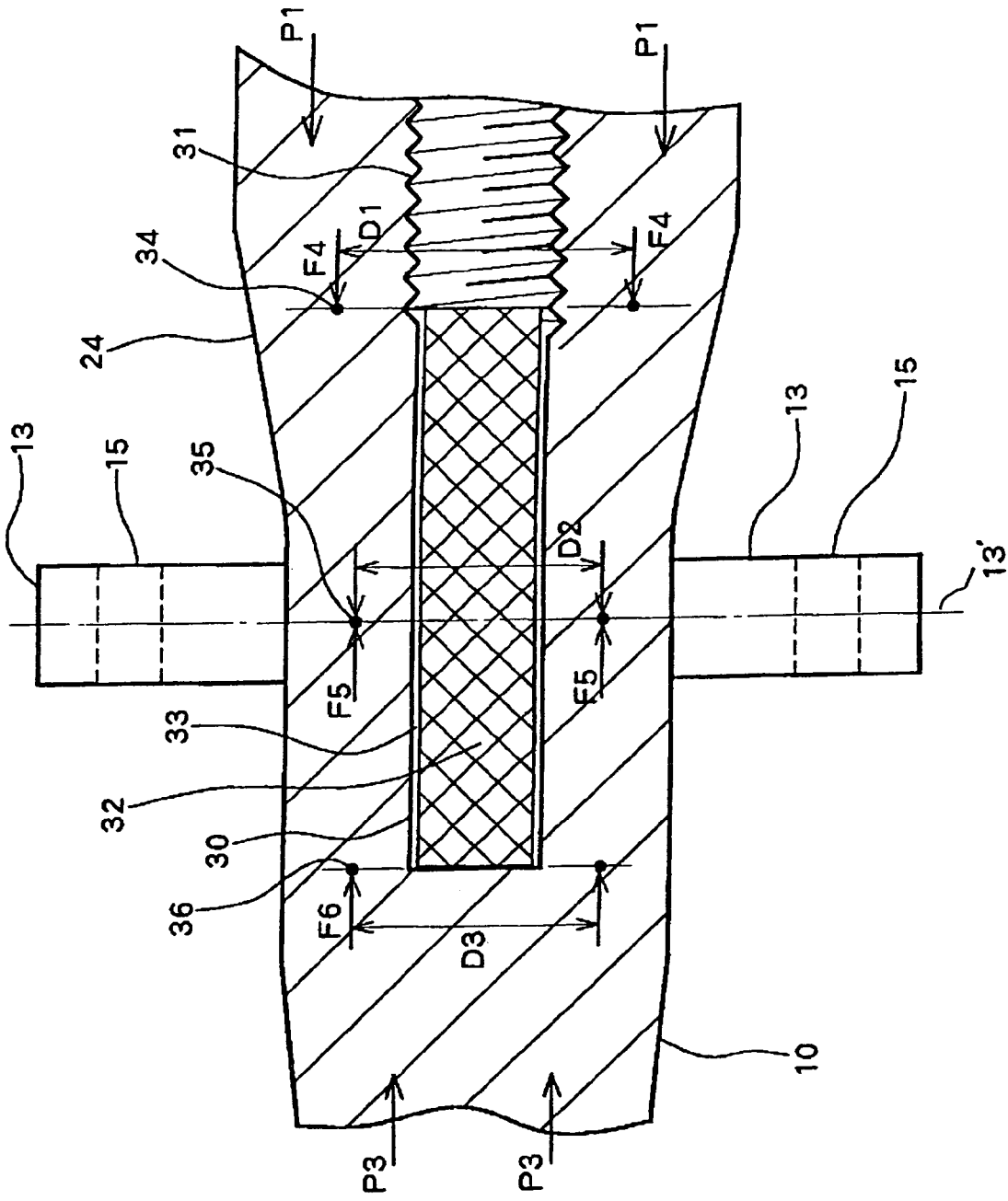
FIG. 11 is a horizontal cross-sectional view of the flange region of the ultrasonic horn of the sixth embodiment.
Figure 12:
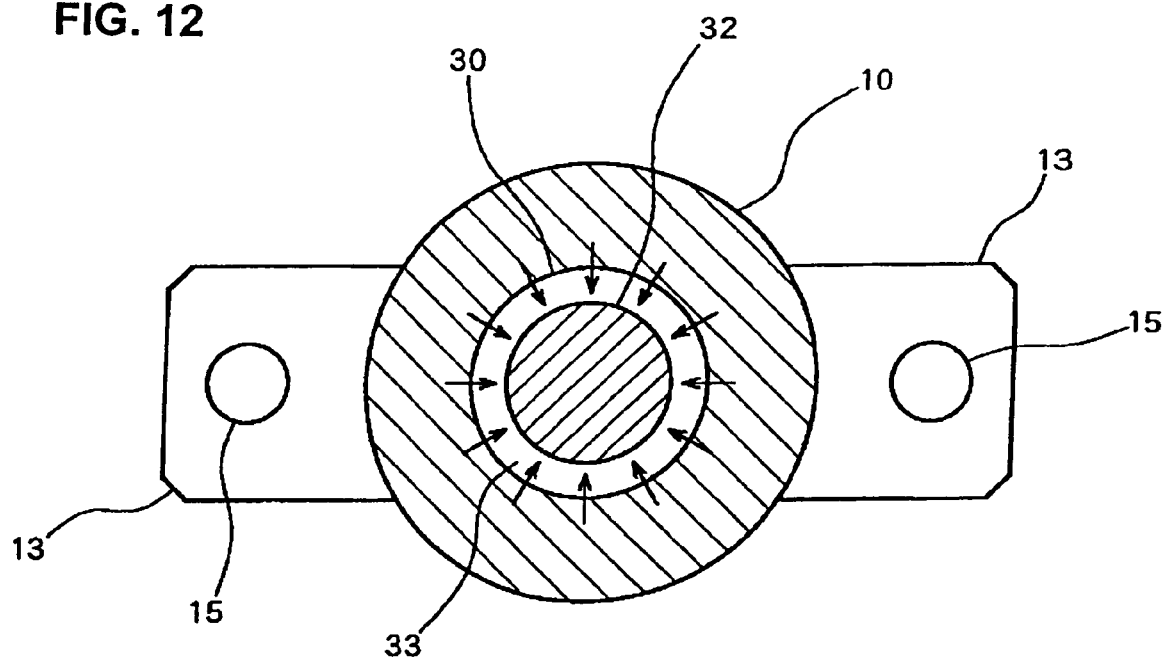
FIG. 12 is an operation diagram of the sixth embodiment of the present invention.

FIG. 9 is a perspective view of the ultrasonic horn of the sixth embodiment, FIG. 10 shows a vertical cross-section of the flange region, and FIG. 11 is a horizontal cross-section of the flange region. The ultrasonic horn 10 in the sixth embodiment is employed in wire bonding apparatuses and has a circular cross-sectional shape in the front end portion, flange region, and rear end portion. The diameter gradually diminishes from the flange region to the front end portion for the purpose of amplitude magnification, and the front end portion is narrowest in diameter. At this front end portion is attached a capillary (not shown) that is a processing device. Furthermore, an ultrasonic vibrator 11 is secured to the rear end portion of the ultrasonic horn 10. As in the first embodiment, flanges 13 are formed to a portion that constitutes a vibration node. These flanges 13 are formed on the two lateral surfaces of the ultrasonic horn 10 so as to be integral with the ultrasonic horn 10 by a cutting process. The ultrasonic horn is secured to, for instance, a bonding apparatus using the mounting holes 15 opened in the flanges 13.

The ultrasonic horn of the sixth embodiment has a cross-sectional shape varying portion 24 that extends from the flange region in the direction of the rear end portion; in other words, it extends from the flanges 13 of the ultrasonic horn 10 toward the rear end portion. The cross-sectional shape varying portion 24 has a trumpet shape formed by turning a circular arc about the center axis of the ultrasonic horn 10, so that the cross-sectional shape of the cross-sectional shape varying portion 24 becomes larger from the flange region toward the rear end portion.

In this ultrasonic horn 10 of the sixth embodiment, a center hole 30 is formed in its interior, and a core rod 32 is coaxially inserted in this center hole 30 from the rear end portion of the ultrasonic horn and is secured in the center hole 30 by a fixing bolt 31. The bore of this center hole 30 is, as best seen from FIG. 10, very slightly larger than that of the core rod 32, and a minute circular ring-shaped gap 33 is formed about the outer circumference of the core rod 32. The center hole 30, core rod 32, and circular ring-shaped gap 33 are provided so as to be, as seen from FIG. 11, symmetrical fore and aft with respect to the flange centerline 13' in the longitudinal direction (axial direction of the horn 10), with one end of each thereof extending to the cross-sectional shape varying portion 24. The length of this circular ring-shaped gap 33 in the longitudinal direction (axial direction) need only be equal to or greater than the thickness of the flanges 13; however, in this sixth embodiment, the length of this circular ring-shaped gap 33 in the longitudinal direction (axial direction) is greater than the thickness of the flanges 13 and is even greater than the diameter of the flange region of the ultrasonic horn.

Next, the operation of the ultrasonic horn 10 of the sixth embodiment of the present invention will be described.

As in the first embodiment, due to the ultrasonic vibration generated by the ultrasonic vibrator 11, the flange region that is at a node of vibration is subjected to compressive stress in the longitudinal direction (axial direction) of the ultrasonic horn 10.

The deformation about the circular ring-shaped gap 33 that occurs when such compressive stress is applied to brought to bear can be described as follows: As seen from FIG. 11, a compressive stress P1 acting from the rear end portion of the ultrasonic horn 10 acts as a compressive stress also on the ultrasonic horn cross-section at the rear end portion of the circular ring-shaped gap 33. By multiplying the cross-sectional area of the ultrasonic horn cross-section in the circular ring-shaped gap rear end portion by the compressive stress P1, a circular ring load F4 that acts on the stress center circle 34 (see FIG. 10) in the ultrasonic horn cross-section at the circular ring-shaped gap rear end portion (see FIG. 11) can be found. Here, the size of the diameter of the stress center circle 34 ordinarily takes an intermediate value of the difference between the bore of the center hole 30 in the circular ring-shaped gap rear end portion and the diameter of the outer surface of the ultrasonic horn; and when it is necessary to consider the stress distribution, then the diameter of the stress center circle 34 is equal to an average value found by effecting weighting with the stress distribution in the radial direction. As a result, the compressive stress P1 from the ultrasonic horn rear end portion can be substituted for by the circular ring load F4 acting on the stress center circle 34 in the ultrasonic horn cross-section at the circular ring-shaped gap rear end portion. Likewise, the compressive stress P3 from the front end portion of the ultrasonic horn can be substituted for by the circular ring load F6 acting on the stress center circle 36 (see FIG. 10) in the ultrasonic horn cross-section at the circular ring-shaped gap front end portion (see FIG. 11). Furthermore, at the flange center position which is on the flange centerline 13' (see FIG. 11'), the condition is such that the stresses P1 and P3 from the rear end portion and front end portion have opposite directions but the same sizes. This, by the same method as noted above, can be substituted for by a circular ring load F5 which acts, with the same size but reverse direction, on the stress center circle 35 in the ultrasonic horn cross-section at the flange region.

As seen from FIG. 11 that shows the circular ring loads F4, F5, and F6, and the stress center circles 34, 35, and 36, the stress center circles 34, 35, and 36 have diameters D1, D2, and D3, respectively. D1 is larger than D2 due to the fact that they are in a cross-sectional shape varying portion 24. The stress center circle 35 in the cross-section of the ultrasonic horn at the flange region is positioned more to the inside, with respect to the width of the ultrasonic horn 10, than the stress center circles 36 and 34 which are the ultrasonic horn cross-sections at the front end portion and at the rear end portion, respectively, pf the circular ring-shaped gap 33.

As in the first embodiment, when the stresses are substituted for by circular ring loads, and an element (a part) of the portion of the ultrasonic horn which is between the cross-section of the ultrasonic horn at the flange region and the cross-section of the ultrasonic horn at the rear end portion of the circular ring-shaped gap is extracted, then as described above relative to the operation of the ultrasonic horn of the first embodiment, due to the bending moment(s) caused by the differences in the sizes of the stress center circles 34, 35, and 36, this element deforms such that the diameter becomes smaller toward the direction of the circular ring-shaped gap. As seen from FIG. 12, at the outer surface of the ultrasonic horn, the deformation by which this diameter becomes smaller and the deformation in the direction in which the diameter becomes larger with the expansion caused by the compressive loading are cancelled out, so that the diameter at the outer surface hardly changes at all; and, conversely, on the inner radial side where the circular ring-shaped gap 33 is provided, an expansive deformation is added, in the direction in which the diameter becomes smaller, to the deformation by which the diameter becomes smaller, so that deformation occurs more on the inner radial side.

As seen from the above, the sixth embodiment of the present invention provides the same advantages as the first embodiment, and in addition, the displacement over the entire outer circumferential surface of the flange region of the ultrasonic horn can be made very small. Accordingly, flanges larger in size than the flanges of the embodiment can be attached or provided by integral molding. In view of this, a single flange can be provided over the entire circumference, and not only on the lateral surfaces, of the ultrasonic horn. Such a circumferential flange has a greater supporting strength, and vibration in the up-and-down direction in the ultrasonic horn can be further prevented. Accordingly, wire tip ball diameter defects can be prevented even more, and the demand for higher bonding speeds in wire bonding apparatuses and finer pitch in semiconductor devices can be coped with more sufficiently.

Figure 18:
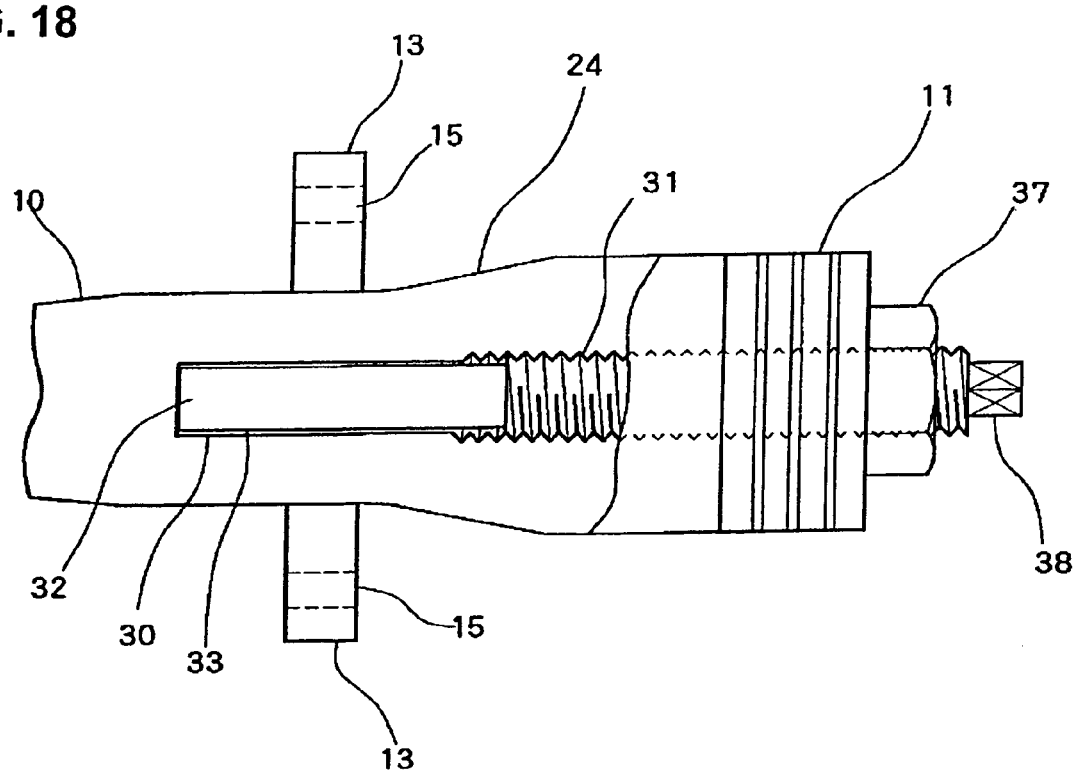
FIG. 18 is an explanatory diagram showing the manner of securing the ultrasonic vibrator and core rod in the ultrasonic horn according to the ninth embodiment.

In the above-described sixth embodiment of the present invention, the cross-sectional shape varying portion 24 is provided between the flange region and the rear end portion of the ultrasonic horn; however, this cross-sectional shape varying portion 24 can be provided between the flange region and the front end portion of the ultrasonic horn. In this structure, the amount of displacement in the mounting holes 15 can be further reduced. Moreover, in the sixth embodiment, the core rod 32 and the fixing bolt 31 are separate parts; however, similar advantages can be realized by making them into a single part; in other words, such a configuration that a protruding portion having the same diameter and length as the core rod is formed at a tip end of the fixing bolt 31 and is screwed in from the rear end portion of the ultrasonic horn would have the same function as a combination of the core rod 32 and the fixing bolt 31. Moreover, a further configuration can also be taken so that, as shown in FIG. 18, a square post portion 38 is provided, so that it can be turned like a screw, so that, at the rear end portion of the fixing bolt 31, the screw is turned by this square post portion to secure the core rod 32, and then the ultrasonic vibrator 11 is fitted in from the rear end portion, so that the ultrasonic vibrator 11 in the horn 10 is secured by a nut 37.

Embodiment 7

Figure 13:
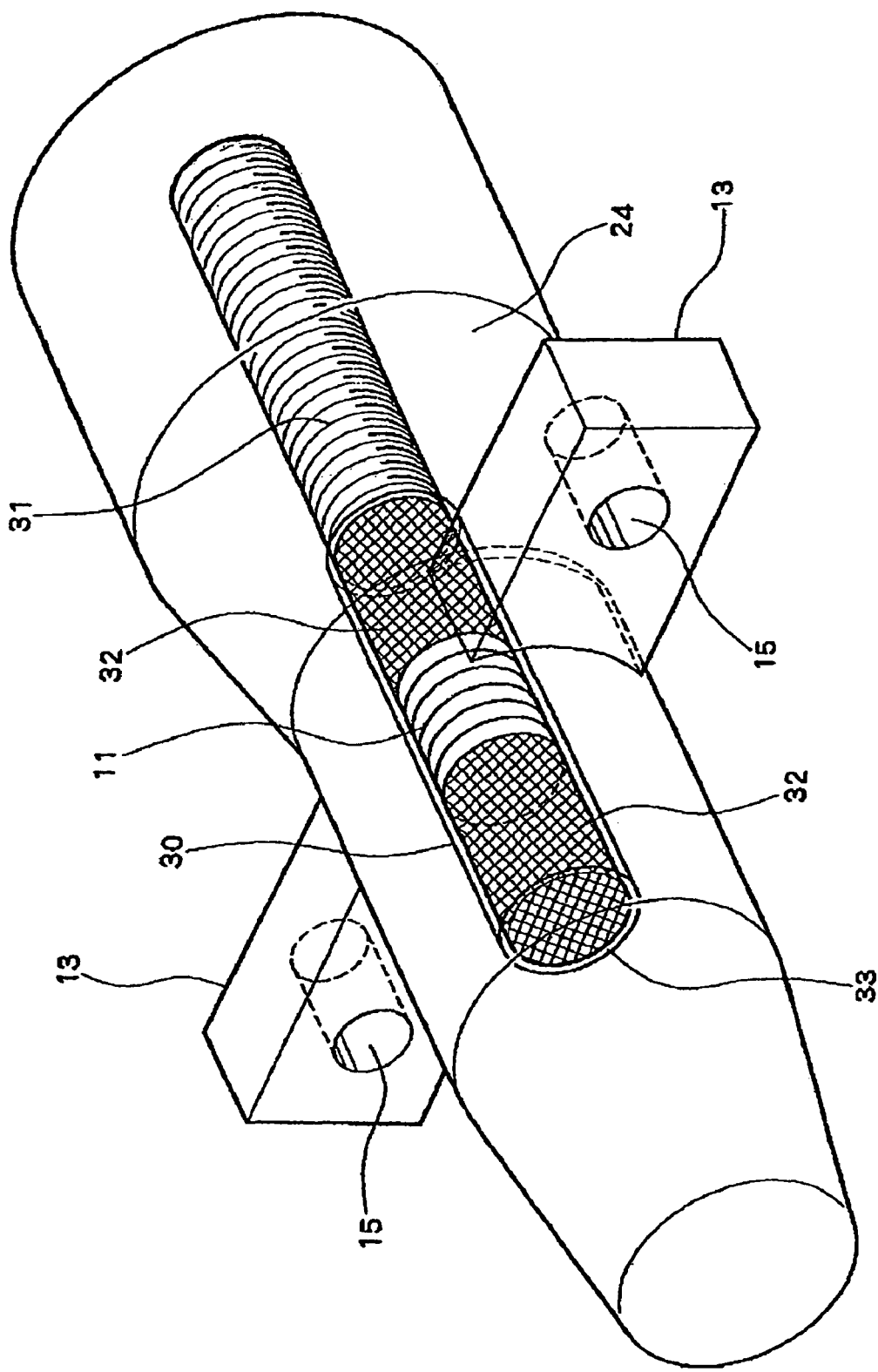
FIG. 13 is a perspective view of the flange region of an ultrasonic horn according to the seventh embodiment of the present invention.

FIG. 13 shows the seventh embodiment of the present invention. The same reference symbols are used for the parts that are the same as those in the sixth embodiment, and further descriptions on those parts will not be provided. The ultrasonic horn 10 in the seventh embodiment of the present invention is employed in wire bonding apparatuses.

In this embodiment, in the interior of the ultrasonic horn 10, a center hole 30 is formed; and inside of this center hole 30, an ultrasonic vibrator 11 and a core rod 32 are secured by a fixing bolt 31 from the rear end portion of the ultrasonic horn. The bore of this center hole 30 is very slightly larger than that of the ultrasonic vibrator 11 and of the core rod 32, and about the outer circumference thereof is formed a minute circular ring-shaped gap 33 as in the fourth embodiment 4. By this gap 33, the ultrasonic horn 10 and ultrasonic vibrator 11 are avoided from coming into contact with each other. In the ultrasonic vibrator 11, as in the fourth embodiment, a vibration node is formed in its middle position in the axial direction; accordingly, flanges 13 are provided on the two lateral surfaces of the ultrasonic horn 10 so that the flanges 13 are located at positions corresponding to the middle position in the axial direction of this ultrasonic vibrator 11. The length of the circular ring-shaped gap 33 in the longitudinal direction (axial direction) is greater in length than the diameter of the ultrasonic horn at the flange region, as in the sixth embodiment.

The operation of the ultrasonic horn 10 of the seventh embodiment of the present invention is similar to that of the sixth embodiment.

More specifically, as seen from FIG. 11 that shows the sixth embodiment, due to the bending moment(s) caused by differences in the sizes of the stress center circles 34, 35, and 36, on the inner radial side, deformation occurs such that the diameter becomes smaller toward the direction of the circular ring-shaped gap, while, at the outer surface of the ultrasonic horn, the deformation by which this diameter becomes smaller and the deformation in the direction in which the diameter becomes larger with the expansion caused by the compressive loading are cancelled out, the diameter at the outer surface hardly changes at all, and the deformation can be made very small over the entire outer circumferential surface of the flange region of the ultrasonic horn. As a consequence, the seventh embodiment provides the same advantages as fourth embodiment; and in addition, similar to the second embodiment of the present invention, in the seventh embodiment, the ultrasonic vibrator 11 and flanges 13 can be provided at locations of the same node, so that flange vibration produced by differences in the position of the node and the positions of the flanges 13 can be prevented, and, in view of the fact that the structure can be made compact because the ultrasonic vibrator 11 is provided inside the ultrasonic horn, vibration in the up-and-down direction can be prevented better, wire tip ball diameter defects can be prevented better, and the demand for even higher bonding speeds in wire bonding apparatuses and finer pitch in semiconductor devices can be coped with.

Embodiment 8

Figure 14:
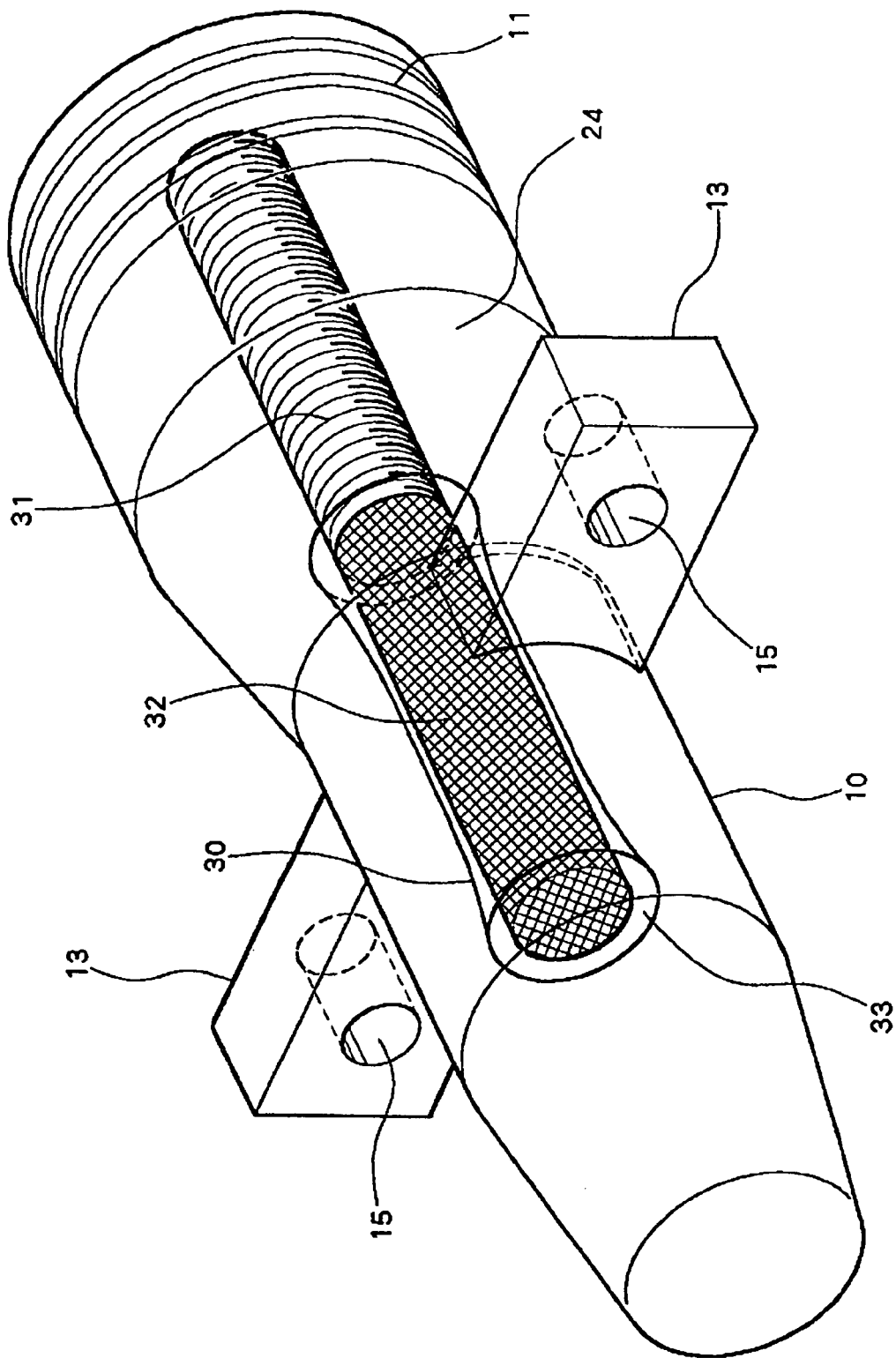
FIG. 14 is a perspective view of the flange region of an ultrasonic horn according to the eighth embodiment of the present invention.

The eighth embodiment of the present invention will be described below with reference to FIGS. 14, 15, and 16. The same reference symbols are used for the parts that are the same as those in the sixth embodiment, and further descriptions on those parts will not be provided. The eighth embodiment of the present invention is employed in wire bonding apparatuses.

More specifically, as in the sixth embodiment, in the ultrasonic horn 10, a center hole 30 is formed in its interior, and a core rod 32 is provided therein, on the same axis as that of the center hole 30, from the rear end portion of the ultrasonic horn, and this core rod 32 is secured by a fixing bolt 31. As indicated in FIG. 16, the bore of this center hole 30, on the flange centerline 13', is very slightly larger than the diameter of the core rod 32, and the bore of the center hole 30 becomes larger toward its rear and front end portions, forming a shape such as that wherein two truncated cones are joined together. Meanwhile, since the core rod 32 is a round rod of uniform diameter, the minute circular ring-shaped gap 33 at the outer circumference of the core rod 32 is narrowest on the flange centerline 13', and it becomes larger in the directions of the rear end portion and front end portion. Furthermore, the center hole 30, core rod 32, and circular ring-shaped gap 33 are provided so as to be symmetric fore and aft, with respect to the flange centerline 13' in the longitudinal direction (axial direction), so that one end (rear end) of each of the center hole 30, core rod 32, and circular ring-shaped gap 33 extend to the cross-sectional shape varying portion 24. As in the sixth embodiment, the length of the circular ring-shaped gap 33 in the axial direction is greater than the diameter of the ultrasonic horn at the flange region.

Figure 15:
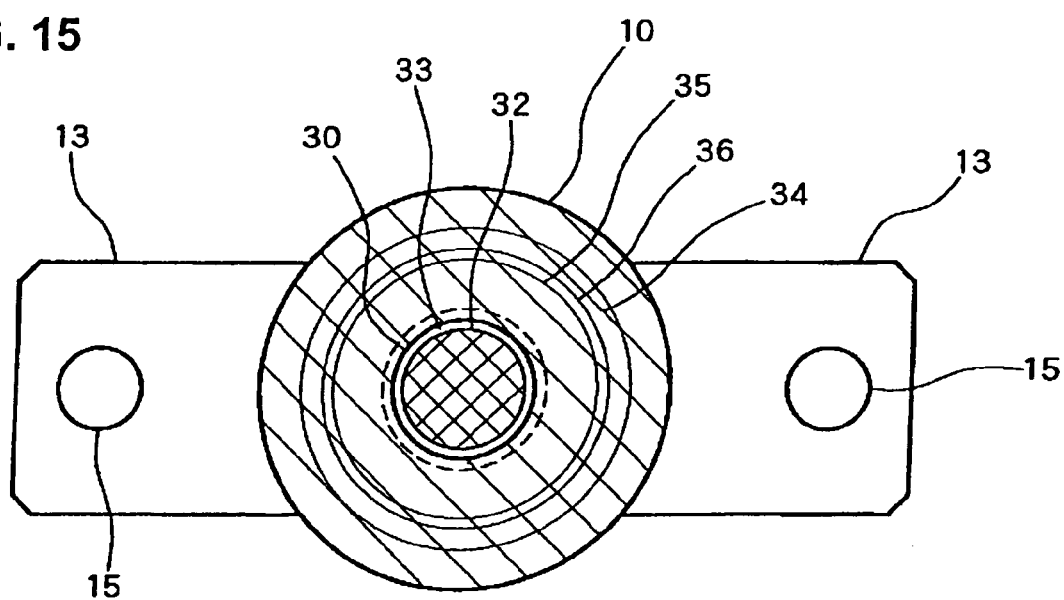
FIG. 15 is a vertical cross-sectional view of the flange region of the ultrasonic horn of the eighth embodiment.
Figure 16:
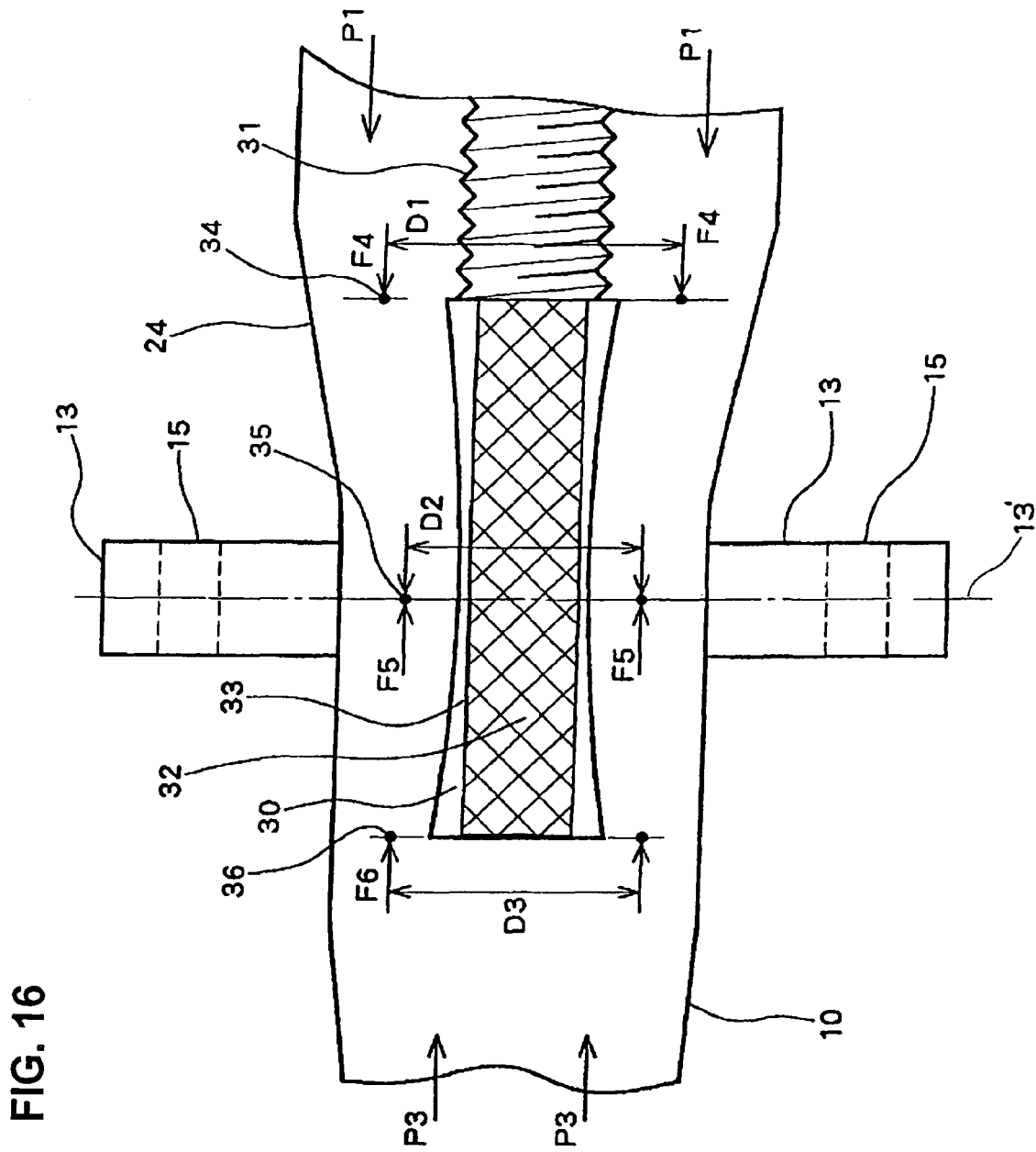
FIG. 16 is a partially cross-sectional top view of the flange region of the ultrasonic horn of the eighth embodiment.

Because of the configuration describe above, as seen from FIGS. 15 and 16, the diameters both of the stress center circle 34 in the ultrasonic horn cross-section at the rear end portion of the circular ring-shaped gap 33 and of the stress center circle 36 in the ultrasonic horn cross-section at the front end portion of the circular ring-shaped gap 33 are greater than that of the stress center circle 35 in the ultrasonic horn cross-section at the flange region. In addition, the stress center circle 35 in the ultrasonic horn cross-section at the flange region is positioned more to the inside than a cylindrical surface joining the stress center circles 36 and 34 in the ultrasonic horn cross-sections at the front end portion and rear end portion of the circular ring-shaped gap. Furthermore, due to the bending moments produced by the difference in the size of the stress center circles 34 and 35 and the difference in the size of the stress center circles 35 and 36, in the vicinity of the flange centerline 13', deformation is effected so that the diameter is smaller toward the direction of the circular ring-shaped gap, more than in the case of the sixth embodiment. At the outer surface of the ultrasonic horn, the deformation by which this diameter becomes smaller and the deformation in the direction in which the diameter becomes larger with the expansion caused by the compressive loading are cancelled out, and the diameter at the outer surface becomes even smaller than in the case of the sixth embodiment of the present invention.

In view of the above, with the eighth embodiment of the present invention, more than with the sixth embodiment, the deformation over the entire outer circumferential surface of the flange region of the ultrasonic horn can be made even smaller; and as a result, more than with the sixth embodiment, provision can be made so that the influence of the minute expansive deformation caused by compressive stress during resonance does not reach the securing portions. Accordingly, in addition to the advantages of the sixth embodiment, further advantages are realized in that the adverse effects on ultrasonic resonance, such as oscillating at frequencies shifted away from ideal frequencies, and leaks are prevented, and bonding quality is enhanced.

In the eighth embodiment of the present invention, as in the sixth embodiment, the configuration can also be made such that a protruding portion is provided at the tip of the fixing bolt 31, having the same diameter and length as the core rod, which is screwed in from the rear end portion of the ultrasonic horn; and a further configuration can also be made so that, as shown in FIG. 18, the core rod 32 is tightly fastened with a square post portion 38 on the rear end portion of the fixing bolt 31, and then the ultrasonic vibrator 11 is secured with a nut 37 from the rear end portion.

Embodiment 9

The ninth embodiment of the present invention will be described below with reference to FIG. 17 and FIG. 18. In this ninth embodiment, the same reference symbols are used for the parts that are the same as those in the seventh and eighth embodiments, and further descriptions on those parts will not be provided.

Figure 17:
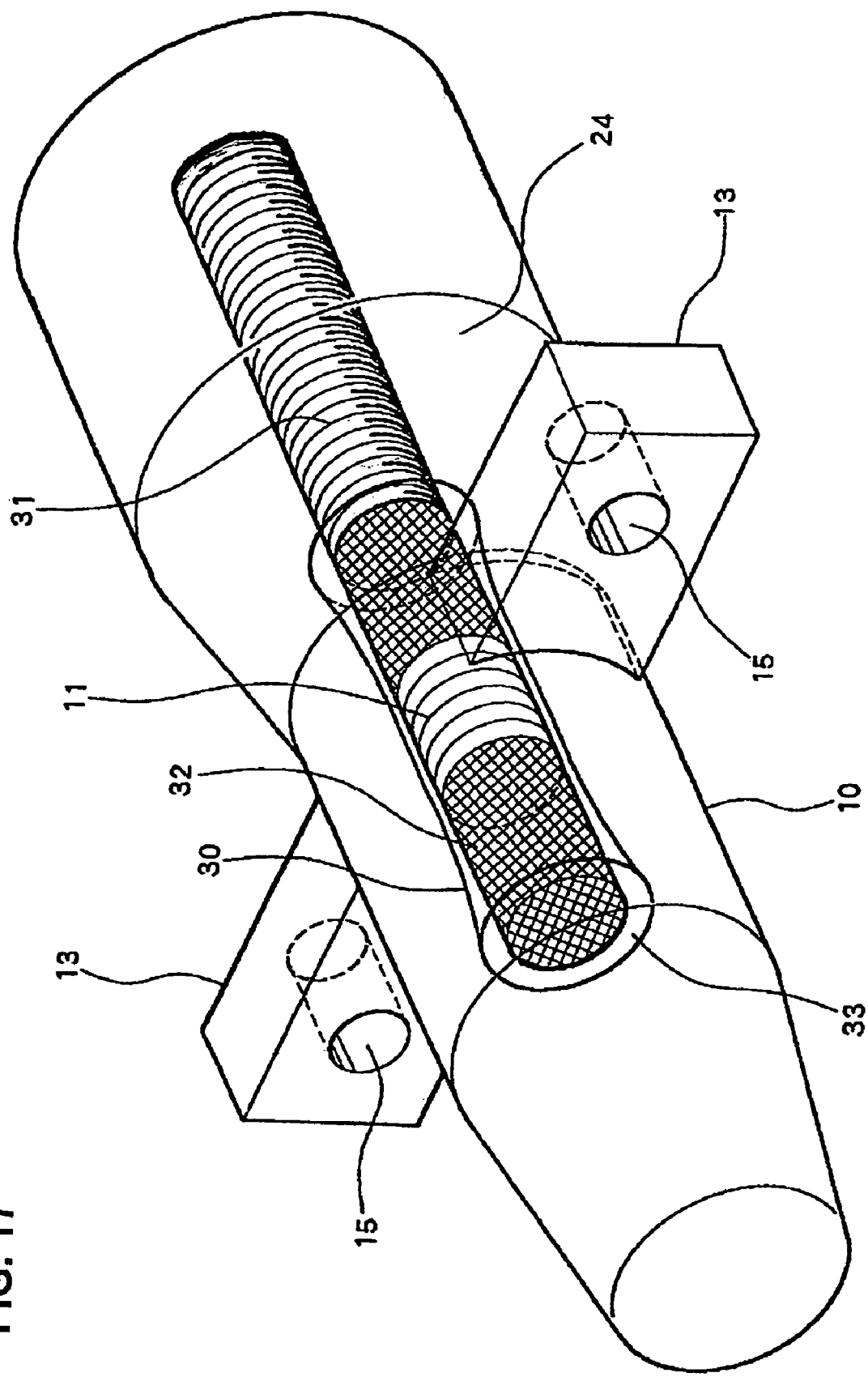
FIG. 17 is a perspective view of the flange region of an ultrasonic horn according to the ninth embodiment of the present invention.

In the ninth embodiment, as in the eighth embodiment, the ultrasonic horn 10 has a center hole 30 of a shape such as that wherein two truncated cones are as shown in FIG. 17 joined together; and inside of this center hole 10 are provided an ultrasonic vibrator 11 and a core rod 32, as in the seventh embodiment of the present invention.

For this reason, the ninth embodiment, likewise to the eighth embodiment of the present invention, is employed in wire bonding apparatuses; and in the horn 10 of this ninth embodiment, the diameters both of the stress center circle 34 in the ultrasonic horn cross-section at the rear end portion of the circular ring-shaped gap and of the stress center circle 36 in the ultrasonic horn cross-section at the front end portion of the circular ring-shaped gap are greater than that of the stress center circle 35 in the ultrasonic horn cross-section at the flange region; and, due to the difference in the size of the stress center circles 34 and 35 and the difference in the size of the stress center circles 35 and 36, in the vicinity of the flange centerline 13', deformation is effected so that the diameter becomes smaller toward the direction of the circular ring-shaped gap 33, more than in the case of the sixth embodiment. In the outer surface of the ultrasonic horn, the deformation by which this diameter becomes smaller and the deformation in the direction in which the diameter becomes larger with the expansion caused by the compressive loading are cancelled out, and the diameter at the outer surface becomes even smaller than in the sixth embodiment. In addition to this advantage, because, as in the fourth and seventh embodiments of the present invention, the ultrasonic vibrator 11 of the ninth embodiment is provided at the same node position as the flanges 13, an advantage that the horn is free of flange vibration that is produced by differences in the position of the node and the position of the flanges 13 is also realized; and, in view of the fact that the ultrasonic vibrator 11 is disposed in the interior of the ultrasonic horn, the structure can be made compact. Therefore, in view of the fact that vibration in the up-and-down direction can be better prevented, wire tip ball diameter defects can be prevented, and the demand for higher bonding speeds in wire bonding apparatuses and finer pitch in semiconductor devices can be coped with.

Embodiment 10

Figure 19:
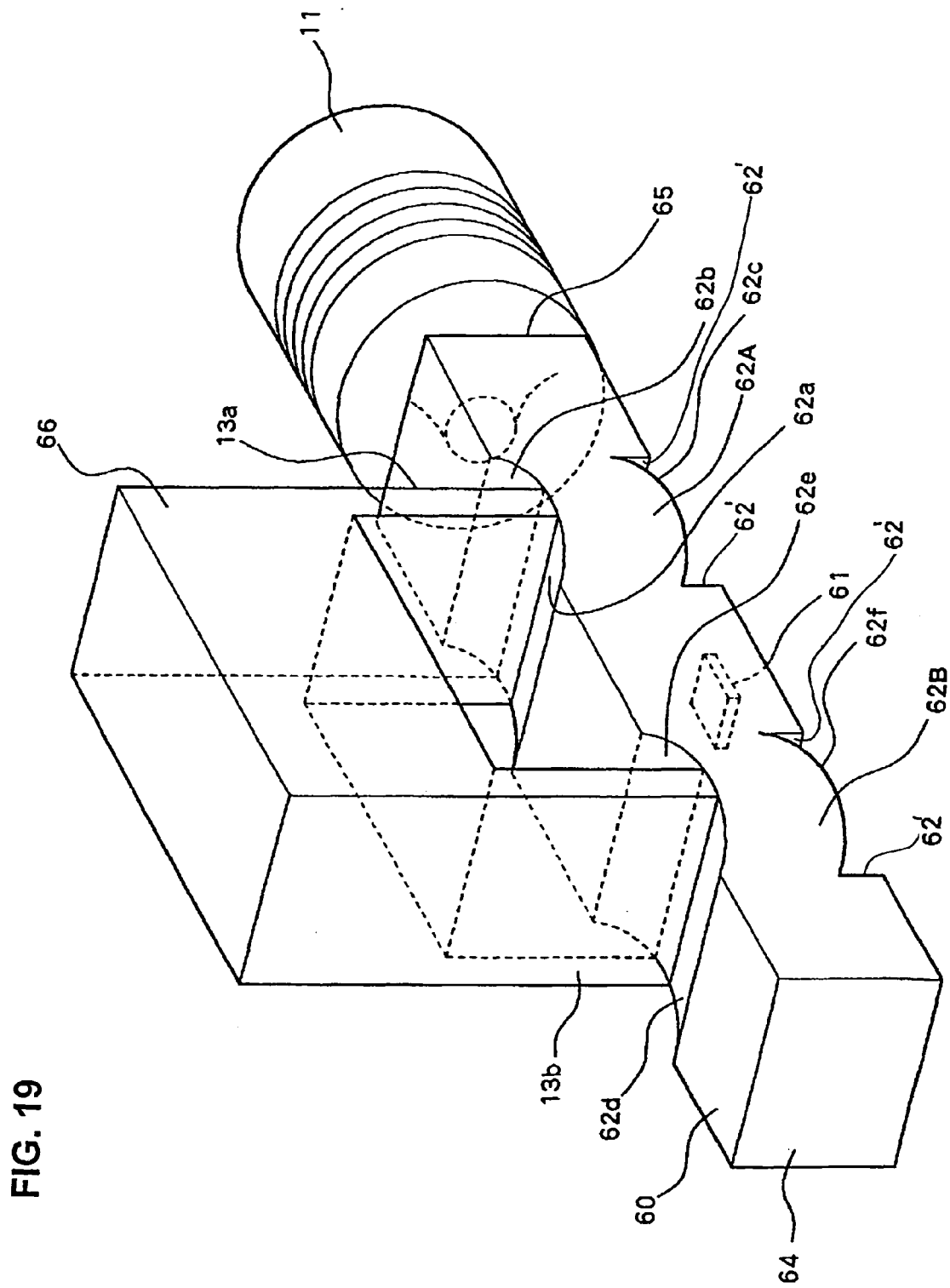
FIG. 19 is a perspective view of an ultrasonic horn according to the tenth embodiment of the present invention.

The tenth embodiment of the present invention will be described below with reference to FIG. 19 and FIGS. 20(a) and 20(b). FIG. 19 is a perspective view of an ultrasonic horn 60 of the tenth embodiment, FIG. 20(a) is a side view of the horn 60, and FIG. 20(b) is an operation diagram of the ultrasonic horn 60.

As seen from FIG. 19, the ultrasonic horn 60 of the tenth embodiment includes an ultrasonic vibrator 11, which is attached to the rear end portion 65, and a tool 61, which is a processing device and is attached to the lower surface in the middle of the horn 60 in its axial (longitudinal) direction. A rear flange 13a is provided on the upper surface of the horn 60 so that it is positioned between the tool 61 and the rear end portion 65, and a front flange 13b is provided on the upper surface of the horn 60 so that it is between the tool 61 and the front end portion 64; and respective flanges are connected by a connecting member 66. The portions of the ultrasonic horn 60 where the flanges 13a and 13b are disposed are formed as downwardly curved portions 62A and 62B, respectively, that are curved from the flanges 13a and 13b sides (or from the top surface of the horn) toward the tool 61 (or to the lower surface of the horn). The downwardly curved portions 62A and 62B make flange regions; and though the center of each of the curved lower surfaces 62c and 62f of the downwardly curved portions 62A and 62B is curved downward the most, the center is designed so as not to protrude further downward than the lower surface of the ultrasonic horn 60, and both ends of the downwardly curved portions 62A and 62B are formed with steps 62' which face upward from the lower surface of the ultrasonic horn 60.

Figure 20A:
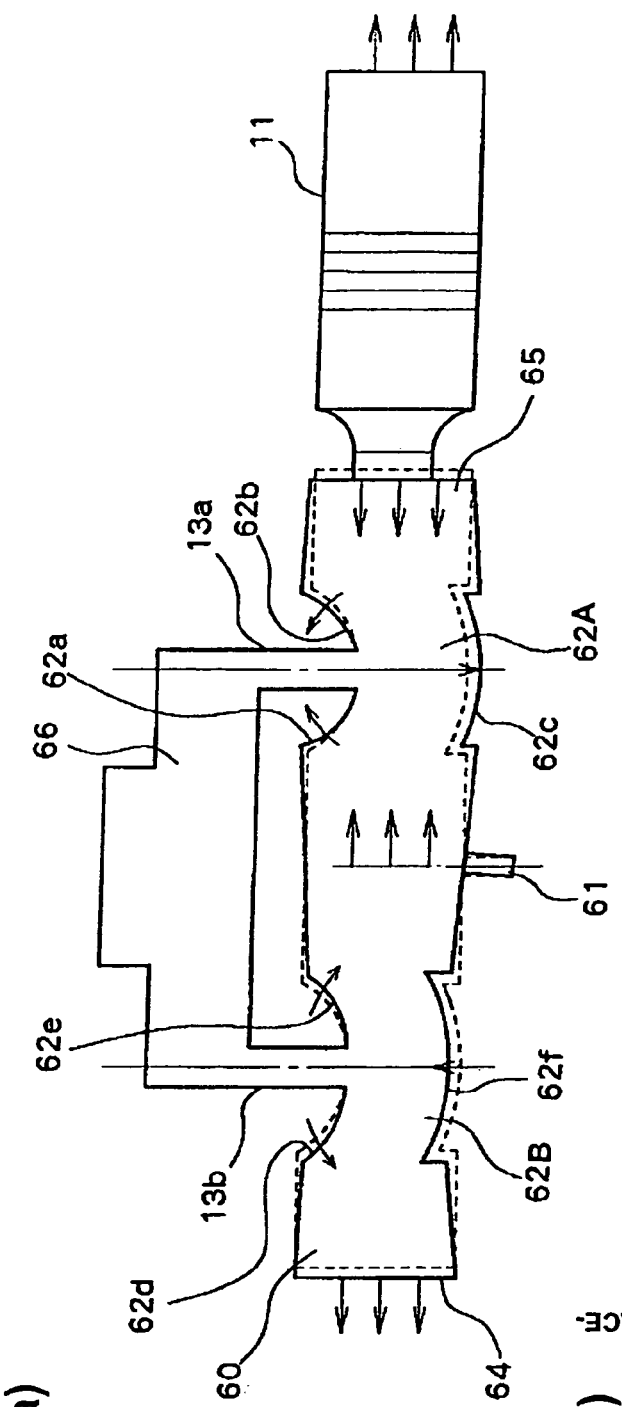
FIG. 20(a) is a side view of the ultrasonic horn according to the tenth embodiment, explaining the operation thereof.
Figure 20B:
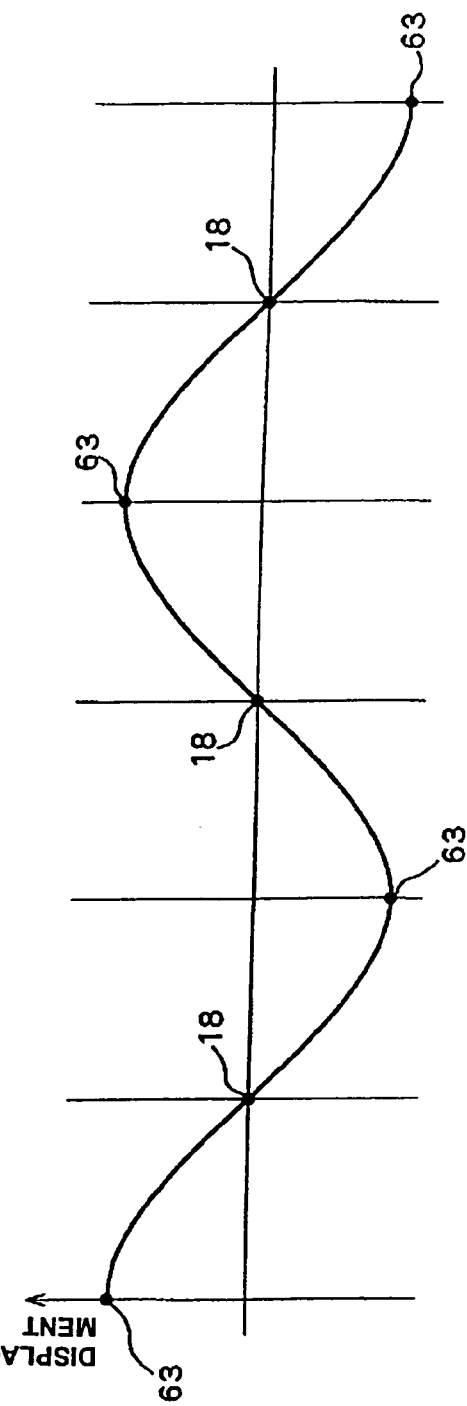
FIG. 20(b) is a graph showing the vibration in the ultrasonic horn of FIG. 20(a)

FIG. 20(a) is a side view of the tenth embodiment of the present invention, showing the operation thereof; and FIG. 20(b) is a diagram showing the behavior of ultrasonic vibration in the horn of the tenth embodiment.

The broken lines in FIG. 20(a) represent the state not in operation wherein no vibration is being generated by the ultrasonic vibrator 11, and the solid lines represent a deformed state in the ultrasonic horn 60 in a condition wherein compressive forces are applied from the rear end portion 65 by the ultrasonic vibrator 11. The ultrasonic vibration generated by the ultrasonic vibrator 11 causes a standing wave of a longitudinal wave to be generated in the ultrasonic horn 60. This standing wave, as shown in FIG. 20(b), becomes, at the rear end portion 65 of the ultrasonic horn, and at the front end portion 64 and middle portion where ultrasound is reflected, an antinode of large amplitude in the fore-and-aft direction, and the tool 61 is provided at the middle antinode. Meanwhile, the standing wave produces nodes 18 where there is almost no amplitude in the fore-and-aft direction. On the front end portion side (left side in FIGS. 20(a) and 20(b)) and on the rear end portion side (right side in FIGS. 20(a) and 20(b)) of the tool 61, respective nodes 18 are generated; and at these positions of nodes 18, flanges 13a and 13b are provided.

In the ultrasonic vibrator 11, as shown by the solid lines in FIG. 20(a), when the condition is such that compressive forces are applied to the rear end portion 65 of the ultrasonic horn 60, the ultrasonic horn 60 between the tool 61 and the rear end portion 65 is subjected to compressive loads from both ends by the standing wave, as indicated by the arrows in FIG. 20(a). When this happens, by the same principle as the operating principle described in FIG. 4(a) to 4(d), the upper curved surfaces 62a and 62b of the downwardly curved portion 62A respectively exhibit bending deformation, toward the direction of the rear flange 13a, from the broken line shape to the solid line shape in FIG. 20(a). The lower surface 62c of the downwardly curved portion 62A, moreover, due to expansion caused by the compressive forces and to bending deformation in the downwardly curved portion 62A itself such that it becomes convex in the downward direction, is displaced from the broken line shape to the solid line shape as shown in FIG. 20(a). However, the attachment part of the rear flange 13a on the upper surface of the downwardly curved portion 62A is hardly displaced at all because the displacement in the downward direction due to the bending deformation and the displacement in the upward direction due to expansion are cancelled out.

On the other hand, between the tool 61 and the front end portion 64 of the ultrasonic horn 60, reverse pulling loads are sustained due to the standing wave described above. When this happens, opposite to the case of the compressive loads described above, the upper surfaces 62d and 62e of the downwardly curved portion 62B respectively exhibit bending deformation from the broken line shape to the solid line shape in FIG. 20(*b*), from the center at the front flange 13b toward the front end portion 64 and the rear end portion 65 of the ultrasonic horn 60. Furthermore, the lower surface 62f of the downwardly curved portion 62B is displaced in the upward direction, from the broken line shape to the solid line shape in FIG. 20(*b*), by contraction caused by the pulling forces and bending deformation in the downwardly curved portion 62B itself such that it becomes convex in the upward direction. However the attachment part of the flange 13b on the upper surface of the downwardly curved portion 62B is hardly displaced at all because the displacement in the upward direction due to the bending deformation and the displacement in the downward direction due to contraction are cancelled out.

As seen from the above, the tenth embodiment of the present invention can be made so that the influence of the minute expansion and contraction deformation caused by compression and pulling stresses during resonance do not reach the horn securing portions due to the fact that the positions of attachment with the ultrasonic horn 60 are not displaced even by compressive and pulling stresses produced by the standing wave caused by the ultrasonic vibrator 11 in both of the two flanges 13a and 13b. For this reason, adverse effects on ultrasonic resonance, such as oscillating at frequencies shifted away from ideal frequencies, and leaks are prevented, enhancing the bonding quality. In addition, the flanges 13a and 13b have sufficient support strength, and vibration in the up-and-down direction in the ultrasonic horn 60 is prevented, so that the demand for higher bonding speeds in flip-chip bonding apparatuses can be coped with Embodiment 11

Figure 21A:
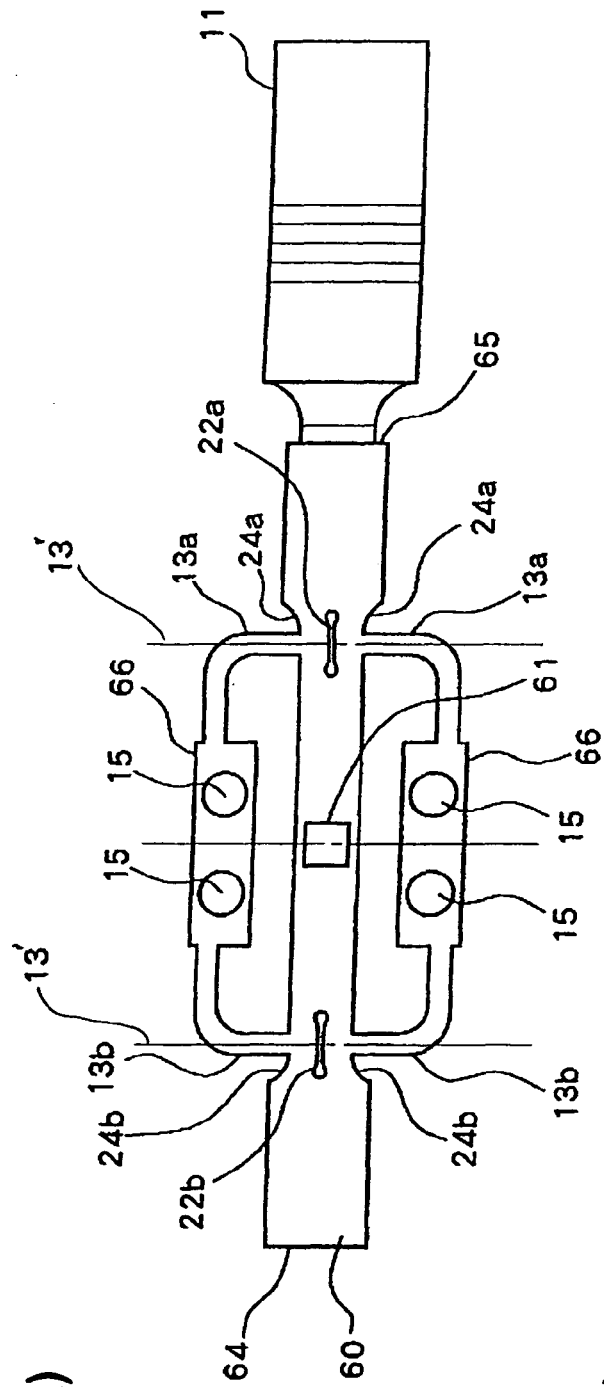
FIG. 21(a) is a top view of the ultrasonic horn according to the eleventh embodiment of the present invention.
Figure 21B:
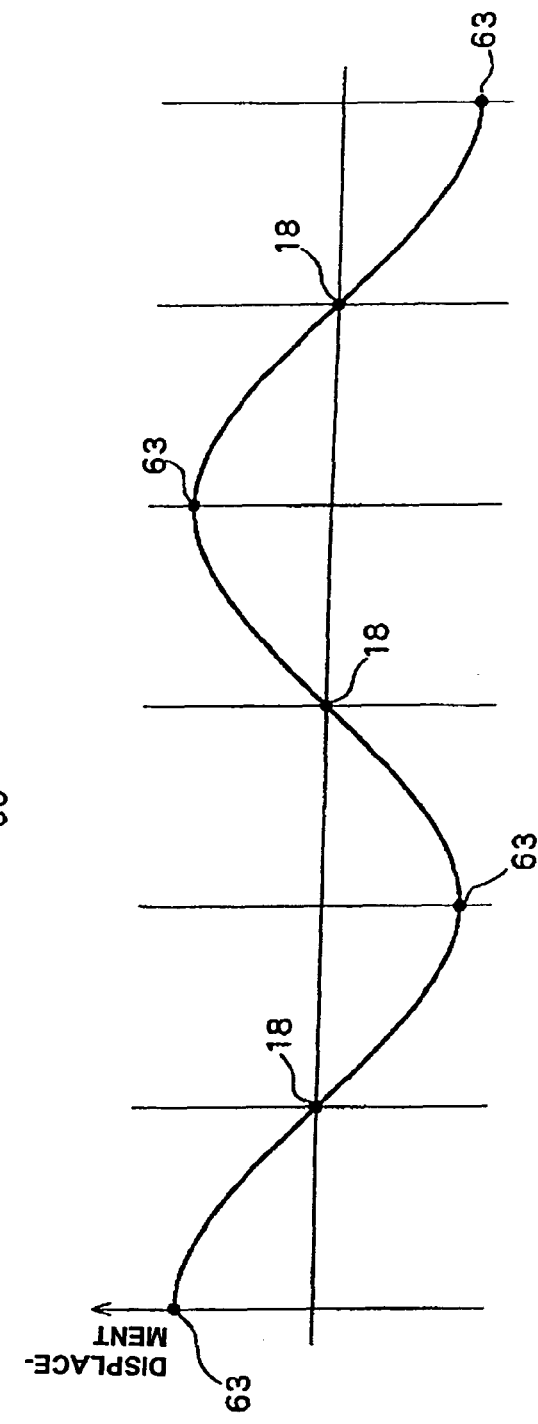
FIG. 21(b) is a graph showing the vibration in the ultrasonic horn of FIG. 21(a)

The eleventh embodiment of the present invention will be described below. with reference to FIG. 21(*a*) and FIG. 21(*b*). FIG. 21(*a*) is a top view of an ultrasonic horn 60 of the eleventh embodiment, and FIG. 21(*b*) is a diagram showing the behavior of ultrasonic vibration in the horn of the eleventh embodiment.

In this ultrasonic horn 60 of the eleventh embodiment as well, as in the above tenth embodiment, an ultrasonic vibrator 11 is attached at the rear end portion 65, generated ultrasound is reflected by the front end portion 64, and ultrasonic vibration antinodes 63 are produced at the middle, at the front end portion 64, and at the rear end portion 65. A tool 61 is disposed at the middle antinode 63, and flanges 13a and 13b are formed on the two lateral surfaces of the horn 60 so that they are at positions of the ultrasonic vibration nodes 18. The flanges 13a and 13b on the two sides of the ultrasonic horn are connected, respectively, by connecting members 66, and each connecting member 66 is provided mounting holes 15. At the positions of the respective flanges 13a and 13b on the center axis of the ultrasonic horn 60, slits 22a and 22b are provided, extending, respectively, from the centers (13') of the flanges 13a and 13b in the directions of the front and rear end portions 64 and 65 of the ultrasonic horn. On the two lateral surfaces of the ultrasonic horn 60, between the rear flange 13a on the rear end portion side and the rear end portion 65, a rear cross-sectional shape varying portion 24a is formed so that it has a curved surface such that the width of the ultrasonic horn 60 widens from the rear flange 13a attachment part toward the rear end portion 65. Likewise, on the two lateral surfaces of the ultrasonic horn 60, between the front flange 13b on the front end portion side and the front end portion 64, a front cross-sectional shape varying portion 24b is formed which has a curved surface such that the width of the ultrasonic horn 60 widens from the front flange 13b attachment part toward the front end portion 64.

When the ultrasonic horn 60 is in operation, the actions of the flanges 13a and 13b, the slits 22a and 22b, and the cross-sectional shape varying portions 24a and 24b are the same as in the first embodiment of the present invention described earlier. What is different is that, as in the tenth embodiment of the present invention described above, when one of the flange regions is in a compressing state, the other flange region will be in a pulling state. However, irrespective of whether in the compressing state or the pulling state, the attachment portions of the flanges 13a and 13b will hardly be displaced at all; and, as a result, provision can be made so that the influence of the minute expansion and contraction deformation does not reach the mounting holes 15 for securing to the apparatus. Therefore, adverse effects on ultrasonic resonance, such as oscillating at frequencies shifted away from ideal frequencies, and leaks are prevented, and bonding quality is enhanced. In addition, the flanges 13a and 13b will have sufficient support strength, vibration in the up-and-down direction in the ultrasonic horn 60 can be thus prevented, and the demand for higher bonding speeds in flip-chip bonding apparatuses can be coped with.

Moreover, in this eleventh embodiment also, as in the second embodiment of the present invention, a plurality of (three or more) slits (two slits 22a and two slits 22b, side by side, respectively) can be provided. Furthermore, as in the fourth and fifth embodiments, the ultrasonic vibrator 11 can be provided in the flange regions, and slits 22 can be formed on both sides of the ultrasonic vibrator 11 disposed in the interior of the ultrasonic horn 60. Furthermore, the ultrasonic vibrators 11 can be provided at the respective positions of the two flanges 13a and 13b, or a single ultrasonic vibrator 11 can be provided at one of the positions of the two flanges 13a and 13b. When the ultrasonic vibrator(s) 11 is provided in the interior of the ultrasonic horn 60, it is preferable that the ultrasonic vibrator(s) 11 be provided so that the middle portion thereof coincides with the center of the flange 13, so that the node 18 of the ultrasonic vibration will be at the center of the flanges 13. When the ultrasonic vibrator 11 is provided only in the interior of one of the flange regions, one slit 22 can be provided in the other flange region, or a plurality of slits can be provided. In cases where the ultrasonic vibrator(s) 11 is thus provided inside of the ultrasonic horn 60, in addition to the advantages of the present invention noted earlier, there will be no need to provide an ultrasonic vibrator 11 at the rear end portion 65; accordingly, the overall length of the ultrasonic horn 60 can be shorter, thus making flip-chip bonding apparatuses compact.

Embodiment 12

Figure 22A:
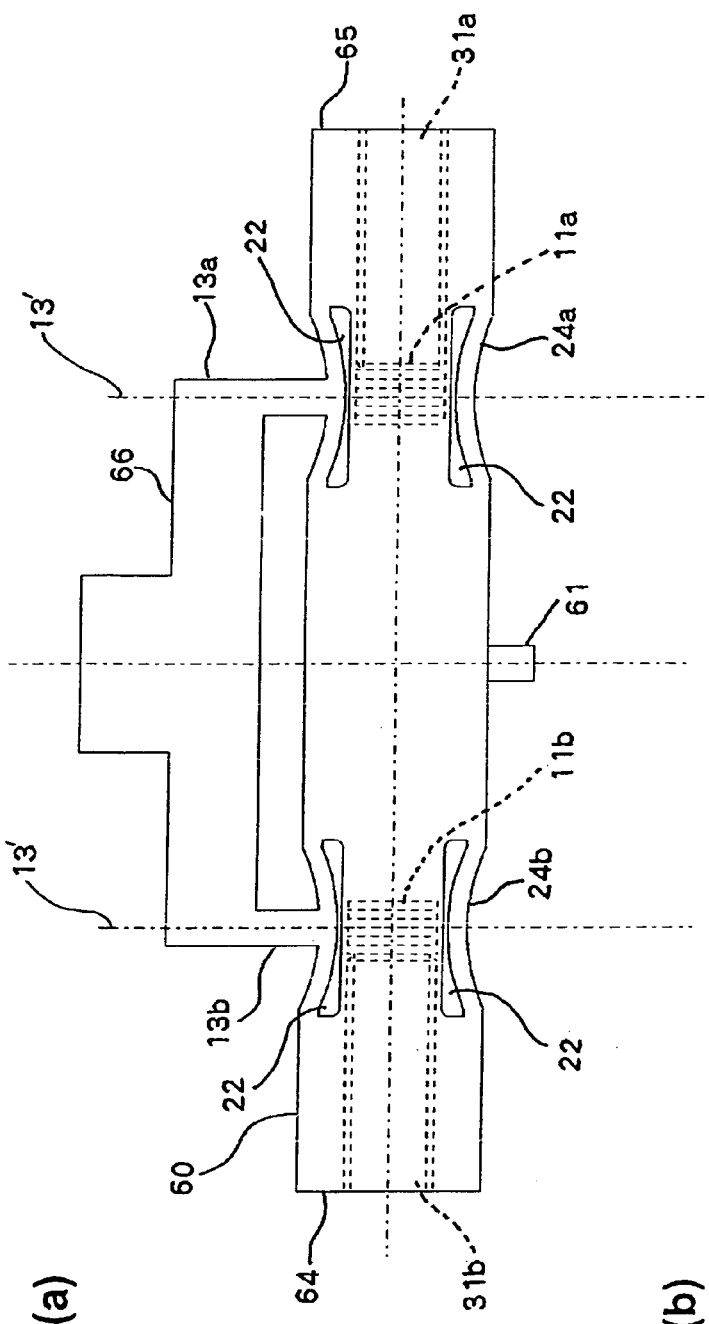
FIG. 22 is a side view of the ultrasonic horn according to the twelfth embodiment of the present invention.
Figure 22B:
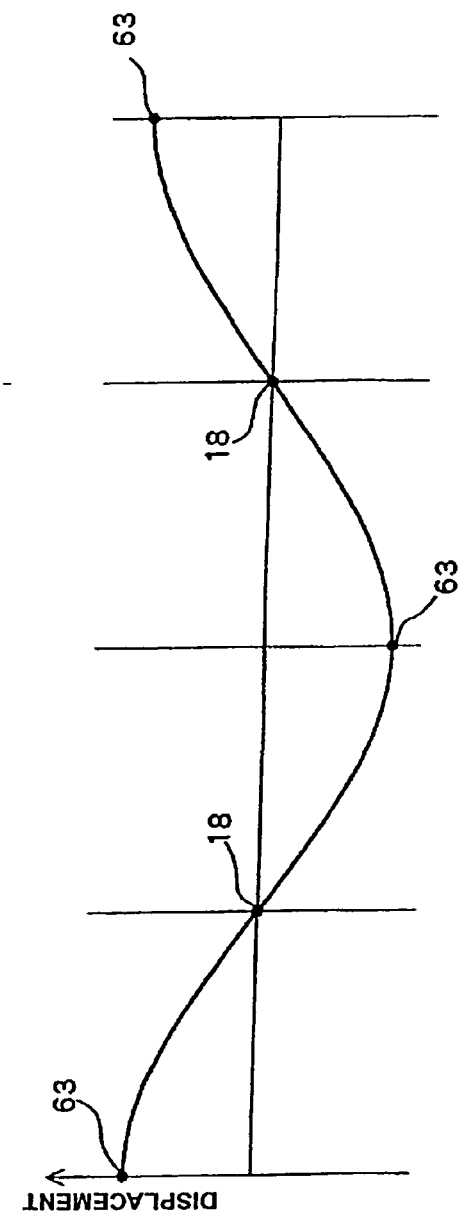

The twelfth embodiment of the present invention will be described below with reference to FIG. 22(*a*) and FIG. 22(*b*). FIG. 22(*a*) shows a side view of an ultrasonic horn 60 in the twelfth embodiment of the present invention, and FIG. 22(*b*) is a diagram showing the behavior of ultrasonic vibration in the horn of the twelfth embodiment.

In this ultrasonic horn 60 of the twelfth embodiment, ultrasonic vibrators 11a and 11b are provided in the interior of the ultrasonic horn 60, so that the overall length of the horn 60 can be shorter. The ultrasonic horn 60 has a cylindrical front end portion 64 and a cylindrical rear end portion 65; and the length of the horn 60 is set so that by the standing wave caused by the ultrasonic vibration generated by the ultrasonic vibrators 11a and 11b, antinodes 63 (see FIG. 22(b)) where amplitude is large are produced at the front end portion 64, at the rear end portion 65, and at the middle portion of the horn, and nodes 18 are produced between the middle portion and the respective front and rear ends of the horn 60. In the outer surface of the ultrasonic horn corresponding to the nodes 18, drum-shaped cross-sectional shape varying portions 24a and 24b are formed; and flanges 13a and 13b are provided on the outer surface, and the flanges 13a and 13b are connected by a connecting member 66.

Furthermore, inside the ultrasonic horn 60, the ultrasonic vibrators 11a and 11b are, respectively, secured by fixing bolts 31a and 31b that are screw-inserted from the rear and front ends 65 and 664, respectively, of the horn 60, so that the ultrasonic vibrators 11a and 11b are positioned on the center axis of the ultrasonic horn and so that the axial center of each of the ultrasonic vibrators 11a and 11b coincides with the centers 13' of each of the flanges 13a and 13b. By providing the ultrasonic vibrators 11a and 11b in this manner, the nodes 18 of the ultrasonic vibration and the centers of the flanges 13a and 13b coincide, and vibration in the flanges 13a and 13b is reduced.

In the ultrasonic horn 60 and above and below the ultrasonic vibrators 11a and 11b, slits 22 are provided. These slits 22 are respectively formed horizontally to extend from one lateral surface to the other (opposite) lateral surface of the horn 60 (thus penetrating the horn horizontally) with the center of each one of the slits 22 being on each one of the centers 13' of the flanges 13a and 13b in the direction of the front and rear of the horn 60.

The actions of each one of the flanges 13a and 13b and of each one of the slits 22 of the ultrasonic horn of this twelfth embodiment in operation are the same as the actions of the sixth embodiment. In other words, the horn of the twelfth embodiment, while having the same advantages as in the eleventh embodiment, also has such an advantage that overall compactness is effected. In this twelfth embodiment as well, it is possible to design so that only one ultrasonic vibrator is provided in one of the flange regions where the flanges are provided on the horn, while the other flange region only has two (upper and lower) horizontal slits.

Embodiment 13

Figure 23A:
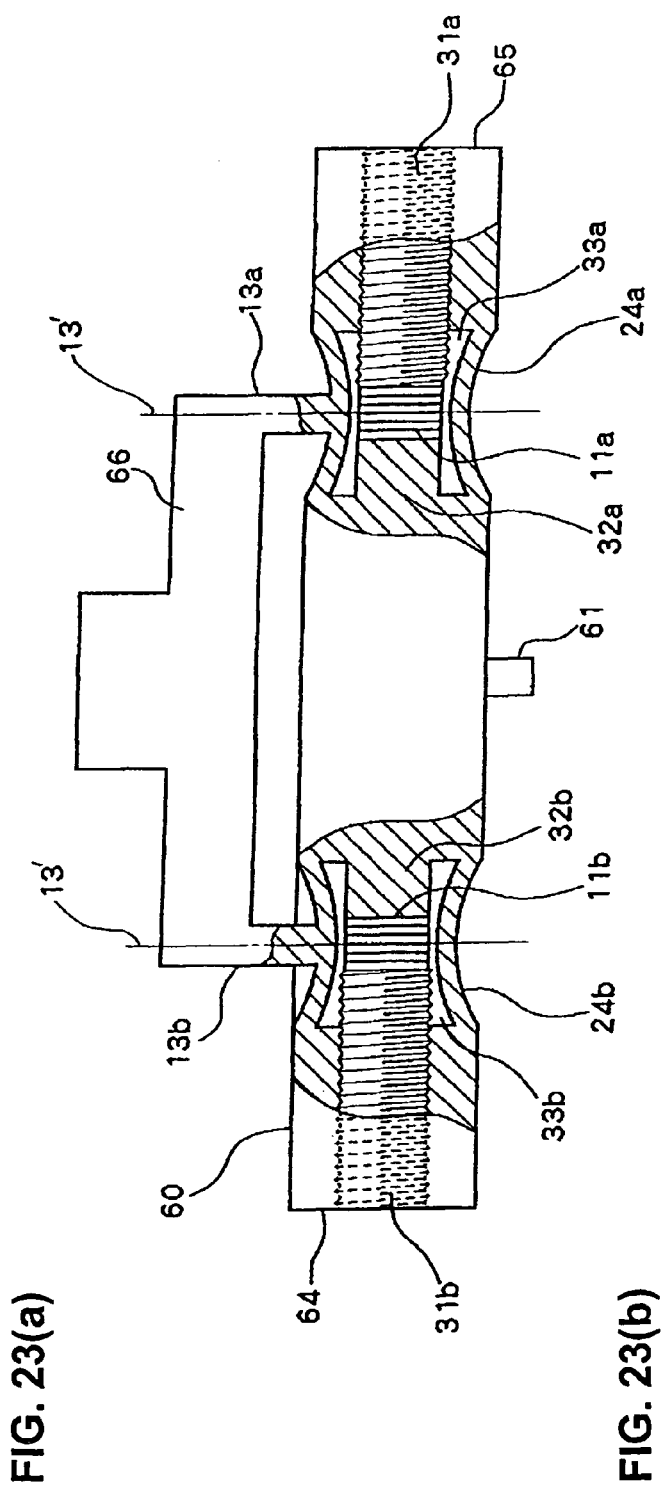
FIG. 23(a) is a partially cross-sectional side view of the ultrasonic horn according to thirteenth embodiment of the present invention.
Figure 23B:
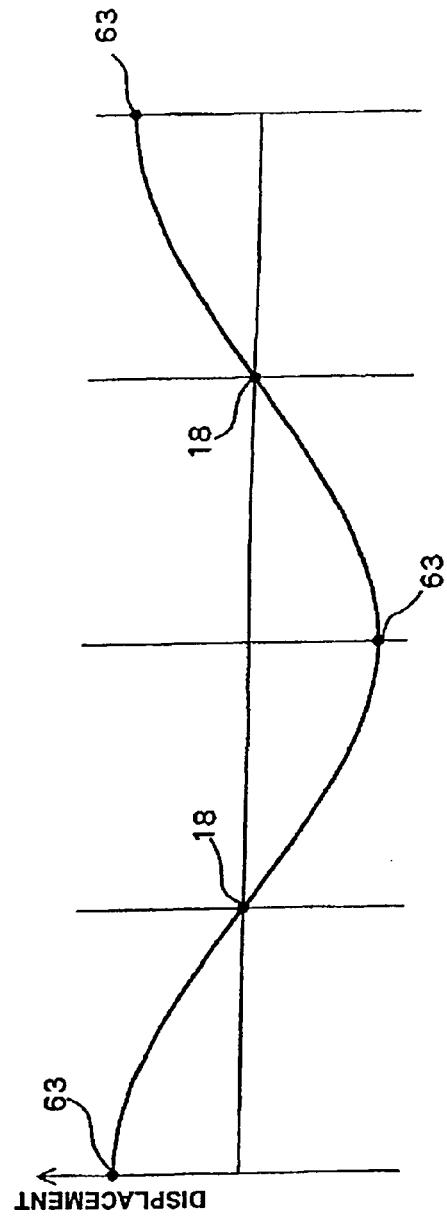
FIG. 23(b) is a graph showing the vibration in the ultrasonic horn of FIG. 23(a)
Figure 24A:
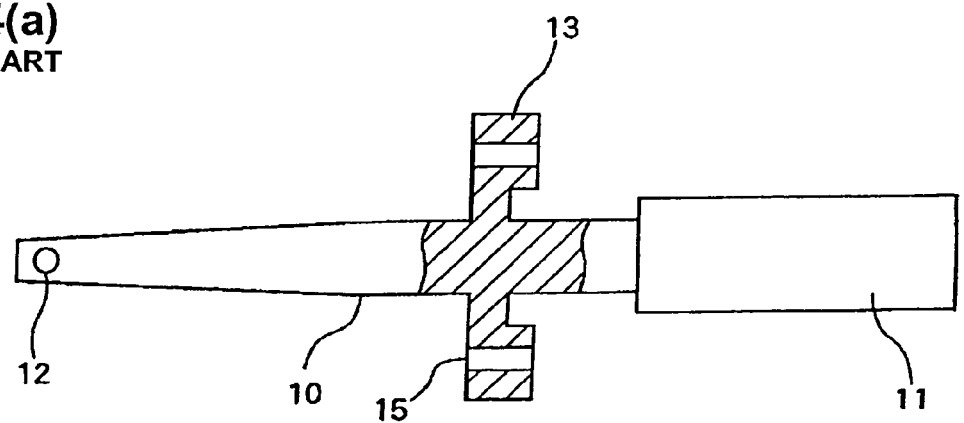
FIG. 24(a) is a partially cross-sectional top view of an ultrasonic horn of related art.
Figure 24B:
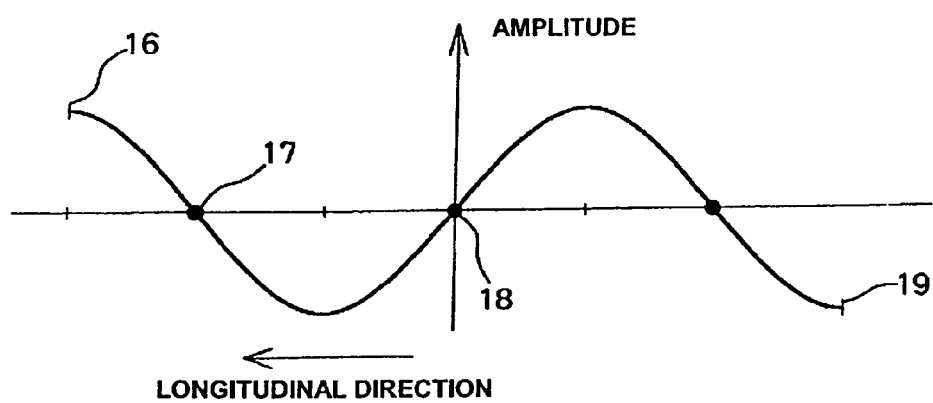
FIG. 24(b) is a graph showing the vibration in the ultrasonic horn of FIG. 24(a)
Figure 25:
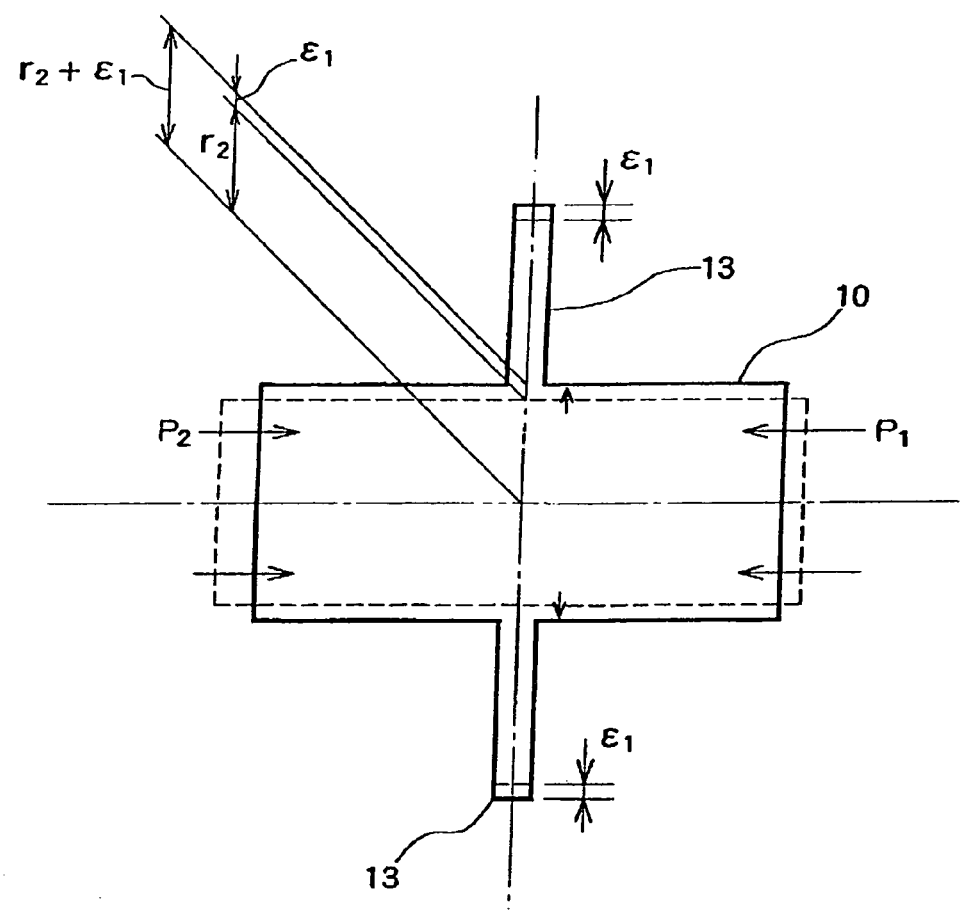
FIG. 25 is a vibration diagram of an ultrasonic horn of related art.
Figure 26:
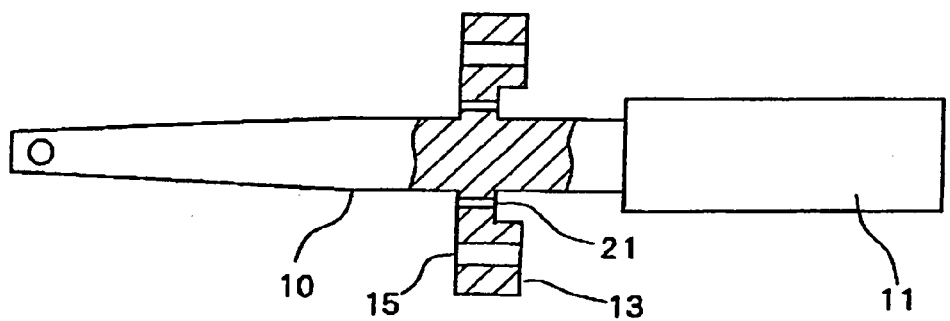
FIG. 26 is a partially cross-sectional top view of an ultrasonic horn of related art.
Figure 27:
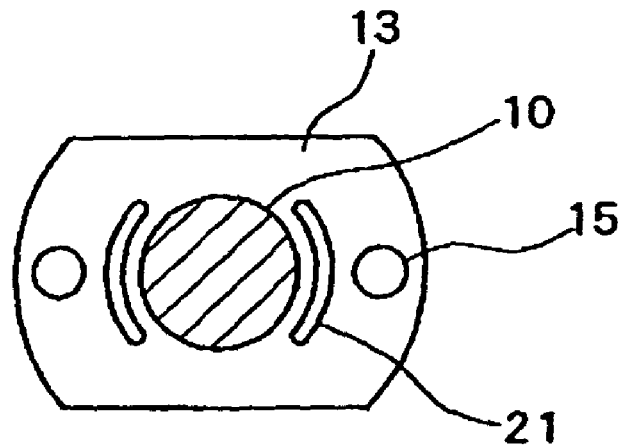
FIG. 27 shows a cross section of the flange region of an ultrasonic horn of related art.
Figure 28:
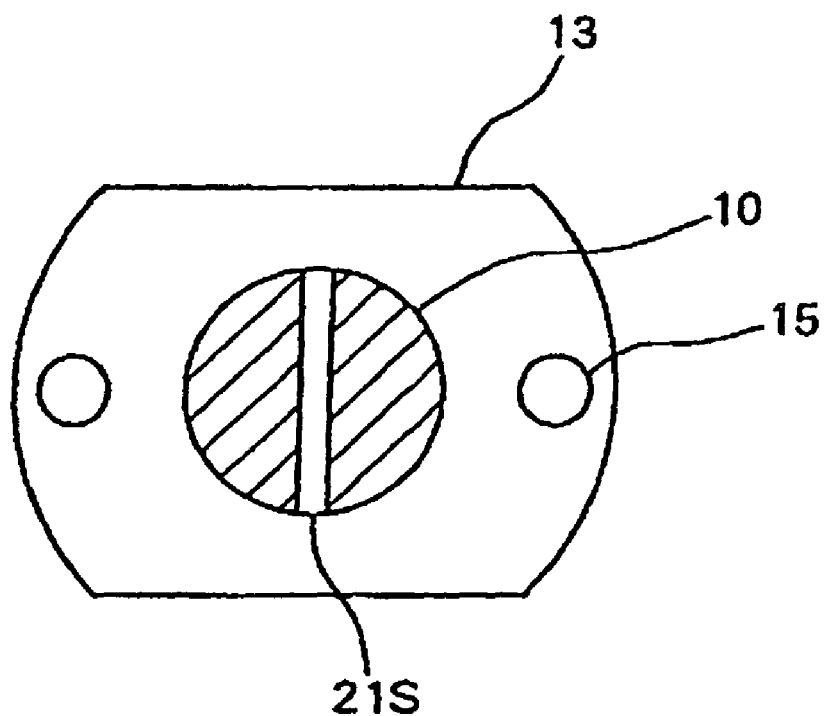
FIG. 28 shows another cross section of the flange region of an ultrasonic horn of related art.

The thirteenth embodiment of the present invention will be described below with reference to FIG. 23(a) and FIG. 23(b). FIG. 23(a) shows a partially vertical cross-section of an ultrasonic horn 60 in the thirteenth embodiment of the present invention, and FIG. 23(b) is a diagram showing the behavior of ultrasonic vibration in the horn of the thirteenth embodiment.

In this ultrasonic horn 60 of the thirteenth embodiment, ultrasonic vibrators 11a and 11b are provided inside the ultrasonic horn 60, so that the overall length of the horn 60 can be shorter. The ultrasonic horn 60 has a cylindrical front end portion 64 and a cylindrical rear end portion 65, and the length of the horn 60 is set so that by the standing wave caused by the ultrasonic vibration generated by the ultrasonic vibrators 11a and 11b, antinodes 63 where amplitude is large are produced at the front end portion 64, at the rear end portion 65, and at the middle portion of the horn, and nodes 18 are produced between the middle portion and the respective front and rear ends. In the outer surface of the ultrasonic horn corresponding to the nodes 18, drum-shaped cross-sectional shape varying portions 24a and 24b are formed; and flanges 13a and 13b are provided on the outer surface, and the flanges 13a and 13b are connected by a connecting member 66.

Furthermore, inside the ultrasonic horn 60, the ultrasonic vibrators 11a and 11b are, respectively, secured between core rod portions 32a and 32b and fixing bolts 31a and 31b, so that the ultrasonic vibrators 11a and 11b are on the center axis of the ultrasonic horn and so that the axial center of each of the ultrasonic vibrators 11a and 11b coincides with the centers 13' of each of the flanges 13a and 13b. By providing the ultrasonic vibrators 11 in this manner, the nodes 18 of the ultrasonic vibration and the centers of the flanges 13a and 13b coincide, and vibration in the flanges 13a and 13b is reduced.

Between the outer surfaces of the ultrasonic vibrators 11a and 11b and the inner surface of the ultrasonic horn 60, circular ring-shaped gaps 33a and 33b are formed. These circular ring-shaped gaps 33a and 33b extend axially, respectively, from the centers 13' of the flanges 13a and 13b in the direction toward the front end portion 64 and toward the rear end portion 65, so that the widths of the circular ring-shaped gaps 33a and 33b become greater as the distance from the centers 13' of the flanges becomes greater, and so that the outer diameters of the circular ring-shaped gaps 33a and 33b become larger as the distance from the centers of the flanges becomes greater.

The actions of the flanges 13a and 13b, of the circular ring-shaped gaps 33a and 33b, and of the cross-sectional shape varying portions 24a and 24b when the ultrasonic horn 60 of this thirteenth embodiment is in operation are the same as the actions of the sixth embodiment. The difference is that, as in the tenth embodiment described above, when one of the flange regions is in a compressing state, the other flange region will be in a pulling state.

Thus, the horn of the thirteenth embodiment, while having the same advantages as the eleventh embodiment, also has such an advantage that overall compactness is effected. In this thirteenth embodiment also, it is possible to design so that only one ultrasonic vibrator is provided in one of the flange regions where the flanges are provided on the horn, while in the other flange region only has a circular ring-shaped gap that is shaped the same as the flange region having the ultrasonic vibrator 11.

As seen from the above, the present invention is applicable to ultrasonic joining apparatuses other than wire bonding apparatuses and flip-chip bonding apparatuses by modifying the processing device provided at the tip or center of the horn. In addition, by modifying the shape of the front tip end, application can be made to medical equipment such as surgical apparatuses that use ultrasound.

The invention claimed is:
1. An ultrasonic horn comprising:
an ultrasonic horn body;
a front end portion;
a rear end portion;
an ultrasonic vibrator;
a slit region formed with a slit;
a matched pair of mounting flanges outside the ultrasonic horn body;
the front end portion being provided with a processing device attached thereto;
the rear end portion comprising a larger diameter than the front end portion;
the ultrasonic vibrator being located on the rear end portion;
the slit region having two slits, each of the two slits being provided entirely inside and through the ultrasonic horn body, each of the two slits that extend symmetrically to fore and aft relative to a flange centerline of the ultrasonic horn body; and the matched pair of mounting flanges being provided on one of node position of vibration generated by the ultrasonic vibrator, the matched pair of mounting flanges that extend in a direction from outside of each of the two slits region of the ultrasonic horn body to a distal end portion thereof, and the matched pair of mounting flanges having a pair of mounting hole regions formed with through holes serving as mounting holes, a center line extending through the each through hole being configured to extend in a direction substantially parallel with the central axis in a longitudinal direction of the ultrasonic horn body, the pair of mounting hole regions being provided on one of the node positions of vibration generated by the ultrasonic vibrator.

2. The ultrasonic horn according to claim 1, wherein for each of the slits, a cross-sectional stress center point in the flange region of between the each slit on a lateral surface side of the ultrasonic horn body and a lateral surface of the ultrasonic horn body is positioned more to an inside, in a width direction of the ultrasonic horn body, than a straight line joining a cross-sectional stress center points at front end portion and rear end portion, respectively, of the each slit in between the each slit and the lateral surface of the ultrasonic horn body as viewed from the each slit opening surface.

3. The ultrasonic horn according to claim 1, further comprising:
a cross-sectional shape varying portion, at least a part of the cross-sectional shape varying portion being on an outer surface of the ultrasonic horn body where each of the two slits region is provided as viewed from the slit opening surface, wherein the cross-sectional shape varying portion is a curved surface located on at least one of intermediate portions between the flange region and the front end portion and between the flange region and the rear end portion as viewed from the slit opening surface.

4. An ultrasonic horn comprising:
an ultrasonic horn body;
a front end portion of the ultrasonic horn body with a processing device attached thereto;
a rear end portion of the ultrasonic horn body larger in diameter than the front end portion of the ultrasonic horn body;
an ultrasonic vibrator being located on the rear end portion; and
a matched pair of mounting flanges provided on both lateral surfaces of the ultrasonic horn being located between the front end portion and the rear end portion, the matched pair of mounting flanges being at a node position of vibration generated by the ultrasonic vibrator, and the matched pair of mounting flanges comprising:
a flange centerline that is substantially at a right angle to the central axis in a longitudinal direction of the ultrasonic horn body relative to the matched pair of mounting flanges;
wherein the ultrasonic horn body comprises:
a first material portion made of a first material substance and formed with at least one slit, the slit being provided on the inside and through the ultrasonic horn body and extending fore and aft relative to a center of the mounting flanges, and having a length being equal to or greater than a thickness of the mounting flanges;
a second material portion made of a second material substance having a smaller Young's modulus than the first material substance, the second material portion extending fore and aft relative to the center of the mounting flanges and being formed, respectively, in an arch shape facing the slit from outer surfaces of ultrasonic horn body, and
a stress center point of a cross-section of the first material portion of a cross-section of the ultrasonic horn body at a flange region being positioned more to an inner side, with respect to a width direction of the ultrasonic horn, than a straight line joining stress center points of the first material portion in cross-sections of the ultrasonic horn at a front end portion and a rear end portion of the slit, thereby securing the mounting flanges without influencing of expansive deformation while canceling the expansion displacement vibration caused by compression produced in the longitudinal direction of the ultrasonic horn by bending displacement vibration in the width direction of the ultrasonic horn.

5. The ultrasonic horn according to claim 4, wherein the ultrasonic horn body is integral with the flanges.

6. The ultrasonic horn according to claim 4, further comprising:
a nut for tightening the ultrasonic vibrator to secure the ultrasonic horn body.

7. An ultrasonic horn comprising:
an ultrasonic horn body;
a rear end portion;
an ultrasonic vibrator;
a front end portion;
a processing device;
two slit regions each formed with a slit;
a matched pair of mounting flanges outside the ultrasonic horn body;
a rear end portion provided with the ultrasonic vibrator thereto;
the front end portion becoming an antinodal end of vibration generated by the ultrasonic vibrator;
the processing device provided between the front end portion and the rear end portion, the processing device being at an antinode position of vibration generated by the ultrasonic vibrator in a longitudinal direction of the ultrasonic horn;
the matched pair of mounting flanges provided on both lateral surfaces of the ultrasonic horn body, and the matched pair of mounting flanges being at a node position of vibration generated by the ultrasonic vibrator in fore and aft directions of the processing device, and
the two slit regions each formed with the slit, the each slit being provided entirely inside and through the ultrasonic horn body, the each slit that extends symmetrically in fore and aft direction, relative to a flange center line of each one of the matched pair of mounting flanges, a center line for the each slit in a longitudinal direction of the ultrasonic horn is parallel to a central axis in a longitudinal direction of the ultrasonic horn body, and the each slit having a length being greater than a thickness of a width of the matched pair of the mounting flanges.

8. The ultrasonic horn according to claim 7,
further comprising a stress center point of each one of the flange regions in a cross-section between a slit on a lateral surface side of the ultrasonic horn body and a lateral surface of the ultrasonic horn body is positioned more to an inside, in a width direction of the ultrasonic horn body, than straight lines joining stress center points of front end portions and rear end portions of each one of the slits regions in cross-sections between the slit on the lateral surface side of the ultrasonic horn body and lateral surface of the ultrasonic horn body.

9. The ultrasonic horn according to claim 8, wherein the stress center point of the flange region in the cross-section of the ultrasonic horn being positioned more to an inside as viewed from the each slit opening surface, in a width direction of the ultrasonic horn body, than a straight line joining stress center points of a front end portion and a rear end portion of the each slit in the cross-section of the ultrasonic horn as viewed from the each slit opening surface.

10. The ultrasonic horn according to claim 7, wherein the slit having a slit width of at least one of front end portion side and rear end portion side of each one of the slits that is greater than a slit width of each one of the slits in the flange regions as viewed from the each slit opening surface.

11. The ultrasonic horn according to claim 7, wherein each one of the cross-sectional shape varying portions is a portion shaped with a curved surface located on at least one of lateral surfaces of the ultrasonic horn body extending fore and aft with respect to respective centers of the matched pair of mounting flanges.

12. The ultrasonic horn according to claim 7, wherein the ultrasonic horn is configured to apply a flip-chip bonding apparatus.

13. The ultrasonic horn according to claim 7, further comprising:

a plurality of cross-sectional shape varying portions, at least a part of the cross-sectional shape varying portion being on an outer surface of the ultrasonic horn body where the slit region is provided as viewed from the slit opening surface.

\* \* \* \* \*